(12) United States Patent
Jóhannsson

(10) Patent No.: US 10,024,892 B2
(45) Date of Patent: Jul. 17, 2018

(54) ASSESSMENT OF POWER SYSTEMS

(75) Inventor: Hjörtur Jóhannsson, Reykjavik (IS)

(73) Assignee: DANMARKS TEKNISKE UNIVERSITET, Kgs. Lyngby (DK)

( * ) Notice: Subject to any disclaimer, the term of this patent is extended or adjusted under 35 U.S.C. 154(b) by 1059 days.

(21) Appl. No.: 14/123,135

(22) PCT Filed: May 30, 2012

(86) PCT No.: PCT/EP2012/060175
§ 371 (c)(1),
(2), (4) Date: May 2, 2014

(87) PCT Pub. No.: WO2012/163979
PCT Pub. Date: Dec. 6, 2012

(65) Prior Publication Data
US 2014/0343881 A1 Nov. 20, 2014

Related U.S. Application Data

(60) Provisional application No. 61/491,310, filed on May 30, 2011.

(30) Foreign Application Priority Data

May 30, 2011 (EP) ..................................... 11168113

(51) Int. Cl.
*H02J 3/18* (2006.01)
*G01R 21/06* (2006.01)
(Continued)

(52) U.S. Cl.
CPC ............ *G01R 21/06* (2013.01); *G01R 21/133* (2013.01); *H02J 3/18* (2013.01); *H02J 3/46* (2013.01);
(Continued)

(58) Field of Classification Search
USPC .......................................................... 702/65
See application file for complete search history.

(56) References Cited

U.S. PATENT DOCUMENTS 6,219,591 B1 4/2001 Vu et al.
6,249,719 B1 6/2001 Vu et al.
(Continued)

FOREIGN PATENT DOCUMENTS

EP 1211775 A1 6/2002

OTHER PUBLICATIONS

European Examination report for Application No. 12723720.4, dated Nov. 12, 2015.
(Continued)

*Primary Examiner* — Mohamed Charioui
(74) *Attorney, Agent, or Firm* — Brinks Gilson & Lione

(57) ABSTRACT

The present invention relates to a method for assessment of a power system and an early warning system for a power system, the method being based on aperiodic small signal instabilities. The power system has a plurality of generators comprising one or more synchronous machines and is represented by a plurality of nodes of power injection, injecting power into a network having a plurality of nodes and branches. The method for assessment of the power system comprises determining a present state of the power system, calculating system Thevenin impedances from each node of power injection in the power system on the basis of the determined present state of the power system, calculating injection impedances from each node of power injection in the power system on the basis of the determined present state of the power system, determining a stability boundary for each generator based on the calculated system Thevenin impedances and the calculated injection impedances. Also a method of early warning for a power system is disclosed.

25 Claims, 12 Drawing Sheets

(51) Int. Cl.
*H02J 3/46* (2006.01)
*G01R 21/133* (2006.01)
*H02J 3/00* (2006.01)

(52) U.S. Cl.
CPC ......... *H02J 2003/007* (2013.01); *Y02E 40/30* (2013.01); *Y02E 60/76* (2013.01); *Y04S 40/22* (2013.01)

(56) References Cited

U.S. PATENT DOCUMENTS

| | | | | |
|---|---|---|---|---|
| 6,754,597 | B2* | 6/2004 | Bertsch | H02J 3/24 324/521 |
| 2008/0074810 | A1 | 3/2008 | Guzman-Casillas et al. | |
| 2010/0324844 | A1 | 12/2010 | Marti | |
| 2013/0176648 | A1* | 7/2013 | De Kock | H02P 9/009 361/23 |

OTHER PUBLICATIONS

Haque M H, "On-line monitoring of maximum permissible loading of a power system within voltage stability limits", Nov. 20, 2002.
Andersson G et al., "Design Aspects for Wide-Arena Monitoring and Control Systems", May 1, 2005.
Johannsson H et al., "Real-time Stability Assessment based on Synchrophasors", Jun. 19, 2011.
Mevludin Glavic et al., "A short Survey of Methods for Voltage Instability Detection", Jul. 24, 2011.
International Search Report for PCT:EP2012:060175, dated Jul. 11, 2013.
Written Opinion for PCT:EP2012:060175, dated Jul. 11, 2013.
International Preliminary Report on Patentability for PCT:EP2012:060175, completed Dec. 20, 2013.

* cited by examiner

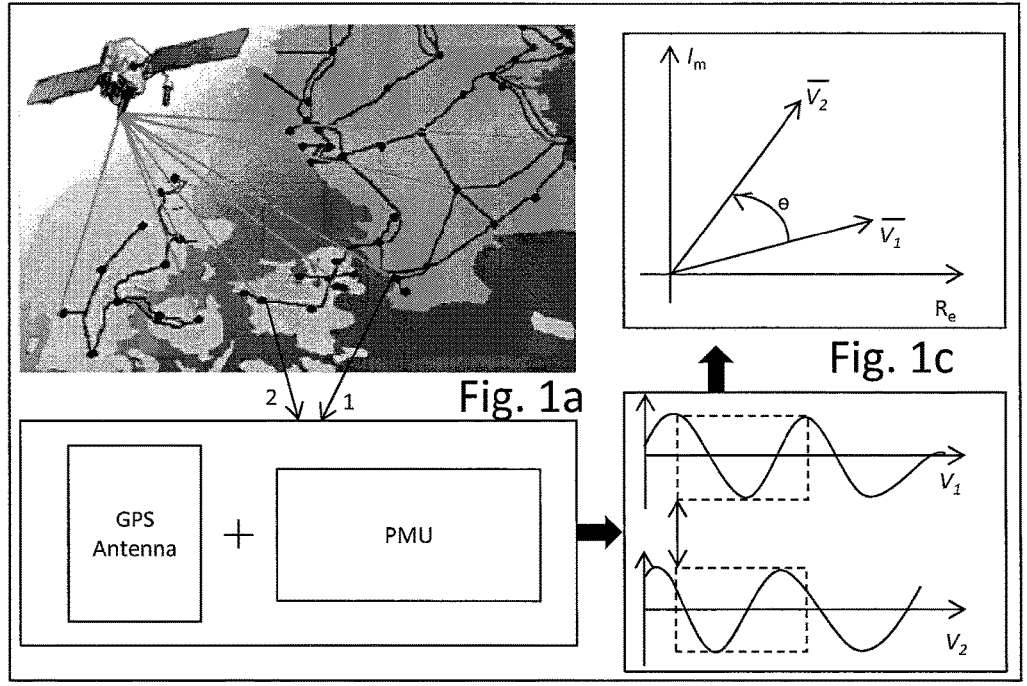
Fig. 1a
Fig. 1c
Fig. 1b
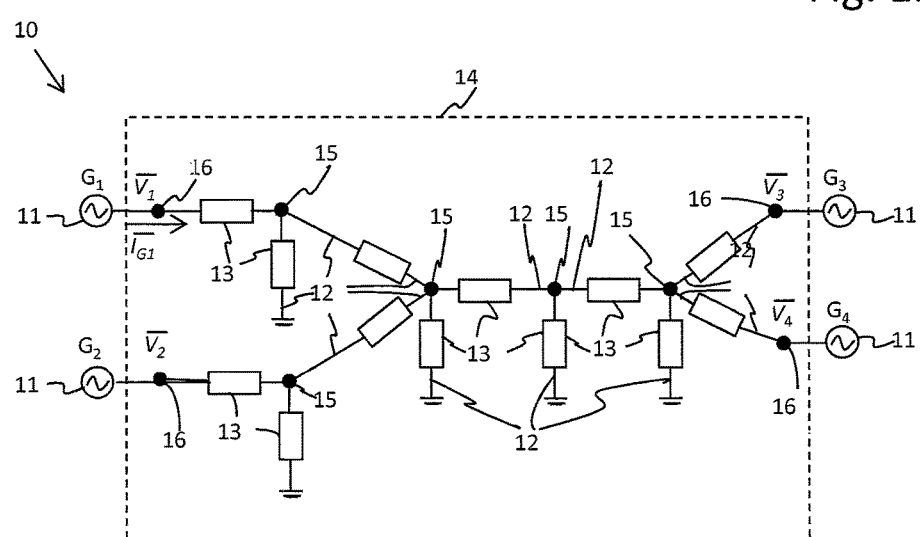
Fig. 2

ASSESSMENT OF POWER SYSTEMS

RELATED APPLICATIONS

This application claims the benefit under 35 U.S.C. § 371 of International Patent Application No PCT/EP2012/060175, having an international filing date of May 30, 2012, which claims priority to European Application No. 11168113.6, filed May 30, 2011, and U.S. Provisional Application No. 61/491,310, filed May 30, 2011, the contents of all of which are incorporated herein by reference in their entirety.

FIELD OF INVENTION

The present invention relates to power systems, and specifically to a method of assessing stability of a power system having a plurality of generators, especially to real-time stability assessment of power system generator. The present invention furthermore relates to the determination of stability boundary conditions for power system generators, and a determination of the system security margins.

BACKGROUND OF THE INVENTION

In recent years, there has been a tendency towards power systems having more and smaller energy sources providing input to the power networks. The focus on climate change and the consequential focus on reduction of $CO_2$ emissions lead away from large coal fired power generators providing a significant share of the total input to the power system, and towards power systems where the share of power from renewable energy sources, such as power from wind, water or solar energy sources, is significantly higher than hitherto. However, renewable energy sources are relatively uncontrollable and typically each renewable energy source is relatively small and they are typically spread over a wide area in the power system.

The existing transmission systems are not necessarily designed to handle these new production patterns, and traditional approaches where security assessment has been carried out off-line by system planners are insufficient in today's complex networks, which was clearly seen from the major blackouts in electric power systems in Sweden and Denmark in September, 2003 and in North-Eastern and Mid-Western United States and parts of Canada in August 2003, each affecting millions of people.

In response to these new production patterns, sophisticated computer tools have been developed for power system analysis and led e.g. to the use of Phasor Measurement Units (PMU's) that provide synchronized measurements in real time, of voltage and current phasors along with frequency measurements. The introduction of PMUs together with advances in computational facilities and communications, opened up for new tools for controlling, protecting, detecting and monitoring of the power systems. However, even though these tools are capable of determining whether a power system is in a stable or an unstable condition, the tools have not been efficient in determining the stability boundaries of the power system or the system security margins.

Some systems have been suggested using only the system voltage phase angle measurements for assessing the system operating conditions. However, it is a disadvantage of these systems that a representation using only the voltage phase angle measurements does not provide a unique representation of a power system operating condition.

Furthermore, multidimensional nomograms have been suggested for the purpose of monitoring the overall system stability or security boundaries, however, the critical boundaries are determined in an offline analysis where multiple critical boundary points have been determined by stressing the system in various directions away from a given base operating point. However, it is a disadvantage of this approach that the boundaries are determined for a specific base case and a fixed system topology. If the system is subjected to any topological change (e.g. tripped lines due to maintenance), the actual approach may introduce an uncertainty for the assessment of security margin, as it has been based on the non-changed topological structure.

On-line monitoring of maximum permissible loading of a power system has also been suggested (M. H. Hague, "On-line monitoring of maximum permissible loading of a power system within voltage stability limits", IEE Proceedings, Generation, Transmission and Distribution, vol. 150, no. 1, 20 Nov. 2002, pages 107-112), wherein locally measurable quantities, such as bus voltage magnitude and the active and reactive components of load power are measured and a maximum permissible loading and voltage stability margin of the power system is estimated at a node in the system. By calculating a maximum loading of a system, transformers, such as e.g. transformer stations, correlated with the node may have to shed load or to adjust e.g. the turns ratio to ensure that the maximum loading of the system is not exceeded. The maximum load point at a node is reached when the Thevenin impedance of the system as seen from the node, equals the load impedance seen from the same node. Thus, this method provides an estimate of the value of maximum power that can be received at the node of concern.

The voltage stability mechanisms are related to the capability of transformers with adjustable winding ratio to maintain constant voltage levels at one of the nodes to which they are connected. If the point of maximum power that can be transmitted to the node is reached, the control actions of the transformers have a destabilizing effect on the voltages, resulting in a very slow uncontrollable decrease in voltage magnitude.

This instability mechanism is caused by the control actions of the adjustable transformers, and the instability process can take several minutes to unfold.

SUMMARY OF THE INVENTION

It is therefore an object of the present invention to provide an assessment of a power system wherein the stability boundaries of a power system are determined.

In a normal operating state of a power system, the system operates in a steady state. However, the system might experience a disturbance, such as a severe disturbance so that a system readjustment, such as generation shifting and increase of spinning power reserve, is needed to restore a normal operating state. If no readjustment on the system is performed, the system may be exposed to further failures and cascading outages.

According to the present invention, the above and other objects are provided by a method for assessment of a power system, such as for assessment of one or more power system generators, the power system having a plurality of generators injecting power into a network having a plurality of nodes and a plurality of branches. The plurality of generators may comprise one or more synchronous machines and the generator may be represented in the network by a plurality of nodes of power injection. The method may comprise determining a present state of the power system, and calculating system Thevenin impedances from each node of power injection in the power system on the basis of the determined present state of the power system. The method may further comprise the step of calculating injection impedances from each node of power injection in the power system on the basis of the determined present state of the power system. A stability boundary for each generator based on the calculated system Thevenin impedances and the calculated injection impedances may be determined.

The power system may be any power system having a number of generators, such as one or more generators, interconnected via a number of nodes in a transmission line grid. Typically, the power system will have a plurality of nodes or busses (N), a plurality of branches (M) and a plurality of generators. The nodes may be nodes interconnecting branches.

According to a further aspect of the present invention, a method for assessment of a power system generator is provided, the generator may inject power into a power system, the power system network having a plurality of nodes and a plurality of branches and one or more other generators. The generator may comprise one or more synchronous machines and the generator may be represented in the network by a node of power injection. The method may comprise determining a present state of the power system, and calculating system Thevenin impedance from the node of power injection in the power system on the basis of the determined present state of the power system. The method may further comprise the step of calculating injection impedance from the node of power injection in the power system on the basis of the determined present state of the power system. A stability boundary for the generator based on the calculated system Thevenin impedance and the calculated injection impedance may be determined.

According to a further aspect of the present invention also a computer program comprising program code means for performing the method(s) as herein described when said computer program is run on a computer is provided, and, furthermore, a computer readable medium having stored thereon program code means for performing the method(s) as herein described when said program code means is run on a computer is provided.

According to another aspect of the present invention, an early warning system for assessing a power system is provided, wherein the power system may have a plurality of generators injecting power into a network having a plurality of nodes and a plurality of branches. The plurality of generators may comprise one or more synchronous machines and may be represented in the network by a plurality of nodes of power injection. The early warning system may comprise a data processing means which may be configured to one or more of the following: obtain a present state of the power system, calculate system Thevenin impedances from each node of power injection in the power system on the basis of the determined present state of the power system, calculate injection impedances from each node of power injection in the power system on the basis of the determined present state of the power system, and/or determine a stability boundary for each generator based on the calculated system Thevenin impedances and the calculated injection impedances. The early warning system may further comprise an interface means for outputting the determined stability boundary.

According to a further aspect of the present invention, a method of early warning for a power system is provided. The power system may have a plurality of generators injecting power into a network having a plurality of nodes and a plurality of branches. The plurality of generators may comprise one or more synchronous machines and may be represented in the network by a plurality of nodes of power injection. The method of early warning may comprise determining a present state of the power system, and calculating system Thevenin impedances from each node of power injection in the power system on the basis of the determined present state of the power system. The method may further comprise calculating injection impedances from each node of power injection in the power system on the basis of the determined present state of the power system, and a stability boundary for each generator based on the calculated system Thevenin impedances and the calculated injection impedances may be determined. For each generator the determined stability boundary may be compared with the injection impedance to determine a generator security margin for each generator, and a warning may be issued if the generator security margin is below a predetermined value.

A unique representation of power system operating conditions, providing full observability of the power system, may be obtained in different ways. As an example, for the system with N nodes and M branches, a unique or full, description of a given operating point may be obtained if the network impedances are known together with all of the N bus voltage phasors or together with all the currents flowing in the M branches along with the voltage magnitude at one bus in the system. Once the network configuration is known, all other network variables may be determined from at least these sets of the M complex current variables and one voltage magnitude (2M+1 real variables) or from the N complex bus voltage variables, i.e. the voltage phasors, or 2N real variables, such as N voltage magnitudes and N angles.

It is an advantage of the present invention that an assessment of the stability of the one or more generators, such as of the one or more synchronous machines, is provided. For example, the rotor angle stability for each generator may be determined which is advantageous to the mere determination of voltage stability since such methods are focussing on different stability mechanisms and hence not capable of detecting the lack of rotor angle stability. A further advantage is that a lack of rotor angle stability may be detected instantly and well before the instability becomes visually apparent from direct measurements of e.g. voltages and active power It is a further advantage that the method is based on the determination of aperiodic small signal instabilities.

It is an advantage of the present invention that one particular mechanism of stability may be used, i.e. the capability of each generator to generate sufficient synchronizing torque such that an operation at a stable equilibrium point may be maintained. It has been found by the inventor that the lack of sufficient steady state synchronizing torque may cause aperiodic increase in rotor angle and a loss of synchronism, typically referred to as aperiodic small signal instability. Thus, the boundary for aperiodic small signal stability may be reached when the point of maximum power that a given generator can inject into a system node in steady state is reached.

In the present invention, the instability, such as the aperiodic small signal instabilities, may be caused by the fact that the generator cannot inject more electric power into the system which may result in sustainable mismatch between the opposing mechanical and electrical torques in the machine. Thereby, the machine may gradually accelerate and go out-of-step, i.e. loose synchronism with the remaining machines in the system.

It is a further advantage of the present invention that the stability boundary may be determined based on one present state of the power system, where the present state may be a snapshot of the state of the power system. Hereby, the calculation is based on the present state, such as a snapshot of the state of the power system, and not on a sequence of time varying snapshots of the state of the power system. Hence, the computational time needed to carry out the assessment is reduced.

According to the present invention, a current or present state of the power system is determined. This present state may be obtained by measuring voltages and/or currents at a number of nodes in the system. Preferably, voltage and current phasors at a number of nodes are determined by measurement, and alternatively or additionally, also the frequency may be determined by measurement at a number of nodes. In a preferred embodiment of the present invention, the measurements are performed in real-time, and preferably the measurements across the power system are time synchronized, such as time synchronized via a GPS signal.

One preferred method of determining the present state of a power system is by using Phasor Measurement Unit measurements. A phasor measurement unit (PMU) is a device that provides synchronized measurements, in real-time, of voltage and current phasors along with a measurement of frequency, thus the PMU measurements may comprises measurements of voltage and current phasors. Synchronism between the individual PMUs may be achieved by the use of a common synchronizing signal from GPS satellites. The synchronization of the sampling process for different waveforms, measured at locations that may be hundreds of kilometres apart, enables the use of the phasors on the same phasor diagram and thus the use of these directly for circuit analysis of the system. The PMUs may be installed in substations or nodes dispersed over a wide area in a power system, and may receive a GPS signal for ensuring synchronisation of the measured values so that the sampled voltage or current waveform may be used to derive the phasor values which may then be plotted in a same complex plane for the purpose of analysis. The advantage of using the PMUs is that the PMUs provide high accuracy, and in that they are widely installed in power systems, they may provide a full observability of the system operating conditions in real-time, and furthermore provide a high repetition rate, such as once per cycle of the system frequency, for the measurements. In that a full observability of the power system is obtained, a further step of estimating unobserved system variables may not be necessary. The PMUs, thus, may provide for a synchronized snapshot of the system conditions in real time. To provide full observability, enough measurements should be determined so as to provide a unique representation of the power system. Preferably, the measurements from the PMUs are provided to a phasor data concentrator, for correlating the data and feeding of the data to applications, such as the present application.

Assessing the conditions of one particular system element in respect to one particular mechanism of stability in may offer the possibility of obtaining a reduced computational time for carrying out the assessment. The reduction in computational time may be related to tailoring of the system description so that only factors which may have a significant influence on the stability mechanism of concern are represented in the system model. The particular system element may be the capability of each generator to generate sufficient synchronizing torque such that operation at a stable equilibrium point may be maintained.

A preferred system representation may be characterized in that all power injections into the system enter the network in a node of constant steady state voltage magnitude. Hereby, additional network nodes or branches may be introduced depending on the type of machine excitation control and the status of the machine protection. Further characteristics may comprise representing the load as impedances in the network, and longer term load dynamics may not be included. In that the method of assessing the power system may evaluate the instantaneous operating conditions, the representation may include the instantaneous impedance as seen from each generator.

Each generator may be a synchronous machine and each generator may comprise a number of synchronous machines operating e.g. in parallel. In some embodiments, the generator is a multiple phase generator, typically such as a three phase generator.

In a stable steady state mode, the generator is typically capable of generating sufficient synchronizing torque so that operation at a stable equilibrium point may be maintained. A lack of sufficient steady state synchronizing torque may cause aperiodic increase in rotor angle and a loss of synchronism. This form of instability may be referred to as aperiodic small signal instability. When for example, the point of maximum power which a given generator may inject into a system node, while maintaining a steady state operation, is reached, the stability boundary, such as the aperiodic small signal stability boundary may also be reached.

It is an advantage of the present invention that for a given generator, the stability boundary may be determined, and, by comparing the stability boundary with the generator operating point, it may be determined whether an increase in voltage phase angle at the node of injection may cause an increase in the injected power to hereby detect when the stability boundary, i.e. such as the aperiodic small signal stability boundary, is crossed. The small signal stability is, generally, the ability of the power system to maintain synchronism when subjected to small disturbances.

In that the generators may be represented by power injections at nodes of constant steady state voltage magnitude, the degrees of freedom associated with the determination of the boundaries for aperiodic small signal stability may be reduced.

By further comparing for each generator the determined stability boundary with the injection impedance, a generator security margin for each generator may be determined. Hereby, an indication of where each generator is positioned relative to the determined stability boundary may be provided.

The system Thevenin impedances from each node of injection may be performed using one LU factorisation of the network admittance matrix which may be calculated or directly obtained from the determined present state of the power system.

Typically, the present state of the power system may be determined sequentially, such as every 20 ms, every 40 ms, every 100 ms, every second, etc. For each or for a predetermined fraction of the sequential determinations of a present state of the power system, the injection impedance, the system Thevenin impedance and the corresponding stability boundary may be determined for each generator. Thereby, the stability boundary may be determined in real-time.

The stability boundary may be determined as $$Z_{inj} = -\frac{Z_{TH}\sin\theta}{\sin\phi_{TH}}$$

wherein $Z_{TH}$ is the magnitude of the system Thevenin Impedance as seen from the generator, $Z_{inj}$ is the magnitude of the injection impedance; $\phi_{TH}$ is the angle of the Thevenin impedance, $\theta$ is the angle of the injection impedance. That is, when the injection impedance $Z_{inj}$ equals $$-\frac{Z_{TH}\sin\theta}{\sin\phi_{TH}}$$

then the generator is at the boundary.

The criteria for stability for a given generator may thus be written as $$C = \left|\frac{\overline{Z}_{inj}\cdot(2\sin\phi_{TH})+j\cdot Z_{TH}}{Z_{TH}}\right|$$

wherein $Z_{TH}$ is the system Thevenin Impedance as seen from the generator, $\overline{Z}_{inj}$ is the injection impedance, $\phi_{TH}$ is the angle of the system Thevenin Impedance $\overline{Z}_{TH}$ as seen from the j'th generator. The expression C is preferably normalized so that the generator is stable if the value C is larger than 1, the generator is unstable if C is less than 1 and wherein the generator is operating at the stability boundary for C=0.

Once the stability boundary is determined, a margin from an operating point of a generator to the stability boundary condition for the generator may be determined. Hereby, the system may be operated with all generators having a margin of for example 10%, or the system may be operated under the condition that no single generator may operate at a margin lower than 2%.

The margin may indicate how much a phase angle for the generator may be increased before the stability boundary is reached.

The stability boundary may be a boundary of maximum injectable power into a given system node so that by injection of power in excess of the maximum injectable power would render the system instable, that is the stability boundary would be crossed.

Furthermore, for a specific generator, it may be determined whether an increase in a voltage phase angle at the corresponding node of injection would cause an increase in the injected power.

Preferably, the stability boundary and/or the system security margin may be automatically determined, such that an operator at any given time has access to information about the stability boundary and/or the system security margin for any given generator in the power system or, as applicable, for any node in the system.

The Thevenin Impedance may be calculated using any known method of calculation, and preferably the Thevenin Impedance may be calculated, as seen from the generator with all other voltage sources, such as generators, of constant voltage magnitude shorted, as $Z_{TH}$=Vth/Ith.

In a preferred embodiment, the Thevenin Impedance for each of the plurality of generators is calculated using only a single LU-factorization of the admittance matrix. Hereby, a larger number of calculations may be performed in one calculating step, providing information about each generator Thevenin Impedance simultaneously.

To determine a present state of the power system, measurement data, such as measurement data sets, such as values of for example measurements of line current or line flows and node voltage phasors may be collected in real-time at a control centre, preferably such as synchronized measurement, where a new measurement data sets of the system state may be updated with a repetition rate of up to 16.66 ms, 20 ms, 40 ms etc. The received dataset preferably provides a full observability of the system such that all injection and system impedances may be determined from the dataset. Hereby, a snapshot of the system operating conditions or a present state of the power system may be obtained or determined sequentially for every discrete point of time, preferably such as for every 20 ms.

The calculation time from determination of the present state of the power system to the current stability boundary depends on the size of the power system, such as on the number of nodes and the number of branches in the power system. For some systems, the calculation time may be between 5 and 10 ms, such as less than a second, such as less than 5 seconds. Preferably, the calculation time is kept shorter than the time interval between the output of first and second sets of data from the system, alternatively, only every second, third or fourth, etc, set of data is used to determine a present state of the power system.

It is an advantage that an observed system condition may be represented as a network of impedances where the points of system power injection occurs at nodes that maintain constant steady state voltage magnitude in that such a representation of the system operating conditions enables the use of deterministic approaches to determine $Z_{th}$ and $Z_{inj}$ which are subsequently used for the stability assessment, and hence short computational times may be obtained for the assessment process. The method according to the present invention is therefore suitable for real-time monitoring of the system generators operating points and their margin to the stability boundary.

It is a further advantage of the disclosed method that a system of early warning may be provided in that machines stability boundaries may be monitored in real time. Potential early warning indicators could for example be when the observed margin to the stability boundary becomes smaller than a predefined minimum margin, or when the relative change in the stability margin over a given period of time is decreasing at a higher rate than a predefined maximum rate.

BRIEF DESCRIPTION OF THE DRAWING

FIG. 1a shows an electric power system, FIG. 1b shows synchronized measurements from two nodes of the electric power system, and FIG. 1c shows the resulting phasors in an impedance plane, FIG. 2 shows a generalized electric power system, where system loads are represented as impedances and the generators are assumed to maintain constant terminal voltage, FIGS. 8b-d show the corresponding trajectory of the injection impedance for generator $G_1$ where FIGS. 8c-d show enlargements of the trajectory in FIG. 8b.

DETAILED DESCRIPTION OF THE DRAWING

Figure 3:
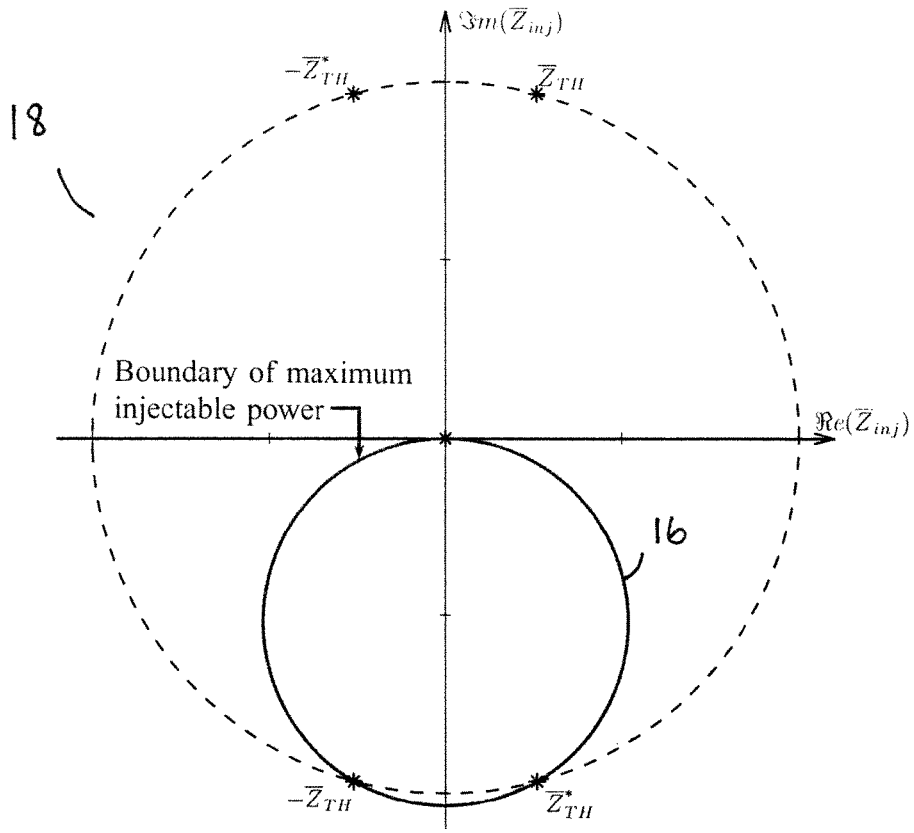
FIG. 3 shows the boundary of aperiodic small signal stability in the injection impedance plane.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. Like elements will, thus, not be described in detail with respect to the description of each figure.

In the present description the following terms may be interpreted as follows:

Voltage phase angle: phasor, is a representation of a sine wave in terms of an amplitude (V) and phase angle (theta). The phasor represents one full period of the sine wave, where the value of the phase angle indicates the phase angle of the sine wave at the beginning of the period used to describe the phasor.

Rotor angle: It is often convenient for analysis and physical interpretation to relate the position of the rotor of a synchronous machine to a voltage or the rotor of another machine. To do this, the induced internal voltage of the synchronous machine is used as an angle reference, and the phase angle difference to the terminal voltage phasor of the machine is called the rotor angle of the machine.

Power stability is the ability of an electric power system, for a given initial operating condition, to regain a state of equilibrium after being subjected to a physical disturbance, with most system variables bound so that practically the entire system remains intact.

Rotor angle stability: The term refers to the ability of synchronous machines, such as generators, to remain in synchronism after being subjected to a disturbance. Small signal rotor angle stability concerns the stability of the system steady state point, and may appear as an aperiodic (non-oscillatory) increase of the rotor angle due to lack of synchronizing torque, or as rotor oscillations of increasing amplitude due to lack of sufficient damping torque.

Aperiodic small signal stability is used to refer to the ability of the system generators to establish sufficient synchronizing torque for a given equilibrium condition. An aperiodic small signal instability appears as aperiodic (non-oscillatory) increase of the rotor angle and subsequent loss of synchronism following a very small disturbance, such as a small increase in applied mechanical power to a generator, or small changes in the system loading.

Frequency stability: relates to the ability of a power system to maintain steady frequency following a severe system disturbance resulting in a significant imbalance between generation and load.

Voltage stability: Refers to the ability of a power system to maintain steady voltages at all nodes in the system after being subjected to a disturbance from a given initial operating condition. Voltage stability is dependent on the system ability to restore equilibrium between load demand and supply.

The terms "bus" and "node" may in the following both be used interchangeably to indicate interconnections in a power system.

FIG. 1a shows a power system 1, where a PMU, or another measurement device, is installed at node 1 and node 2. The synchronized measurements are shown in FIG. 1b, for node 1 and node 2, respectively. FIG. 1c shows the resulting voltage phasors $\vec{V}_1$ and $\vec{V}_2$ plotted in the same complex plane. The phase difference θ between the signals from node 1 and node 2, respectively, is indicated.

In the following, a method of assessing power system stability exemplifying the present invention is provided. The examples provided below are exemplifying embodiments only and should not be considered limiting for the scope of the invention as defined by the claims. The method may comprise determining boundaries for aperiodic small signal stability.

From the power network real-time measurements of system parameter provide so called full observability of the system grid. The full network observability may then be used to establish a deterministic representation of the system conditions, where the system representation has the following characteristics or preconditions:

All power injections into the system enter the network in a node of constant steady state voltage magnitude.

This may result in the introduction of additional network nodes and branches compared to the physical system depending on the type machine excitation control and status of machine protection The load is represented as impedances in the network Hereby, some longer term load dynamics may not be included in the model and the method preferably evaluates the instantaneous operating conditions, so therefore the instantaneous impedance as seen from the generators is preferably represented.

By representing the power injections at nodes of constant steady state voltage magnitude may result in a reduction of the degrees of freedom associated with the determination of the boundaries for aperiodic small signal stability.

In the following, the system in FIG. 2 will be considered when deriving boundaries for aperiodic small signal stability. FIG. 2 shows a power system 10 where all loads are represented as constant impedances 13 and where all generators 11 are assumed to maintain a constant terminal voltage. With all system impedances 13 known, the system operating conditions can be determined from the generators 11 terminal voltages ($\vec{V}_1$, $\vec{V}_2$, $\vec{V}_3$ and $\vec{V}_4$). The power system 10 comprises the generators 11 and the network 14. In the network 14, the generators are represented by nodes of power injection 16. The nodes 15 and the impedances 13 are interconnected via branches 12. In the following this system will be referred to when deriving equations for maximum injectable power. The generators are in FIG. 2 assumed to maintain a constant terminal voltage.

Since the voltage magnitude at the nodes of injection is assumed constant, only changes in voltage phase angles at injection busses may result in changes in power injection. The boundary of maximum injectable power for generator 1, G1, may be determined by fixing $\bar{V}_2, \bar{V}_3$ and $\bar{V}_4$ and determine at which phase angle $\delta_1$ the point of maximum injectable power occurs. The changes in current injection into node 1 may be determined by applying the superposition principle. The voltage at the point of constant voltage magnitude for G1 will thereby be changed by $\Delta\delta$. By applying the superposition principle, the current from G1 ($I_{G1}$ (vector)) can be expressed as the sum of the current flowing from G1 when all other nodes of constant voltage magnitude are shorted) $\bar{I}_{sup,G1}$ plus the current contributions due to all other nodes of constant voltages when node 1 is shorted.

In the present example, the number of generators is 4, so that N=4. For a small change in the angle $\delta_1$, the sum of current contributions will remain unchanged, since it is independent of voltage $\bar{V}_1$. The current due to $V_1$ when all other sources are shorted ($\bar{I}_{sup,G1}$) does, on the other hand, have the same magnitude but its angle will increase by $\Delta\delta$. The apparent power $S_{G1}$, injected into node 1, becomes:

$$\bar{S}_{G1} = \bar{V}_1 \bar{I}_{G_1}^* = \bar{V}_1 \bar{I}_{sup,G1}^* + \bar{V}_1 \sum_{i=2}^{N} \bar{I}_{sup,Gi}^* \qquad (1)$$

For changes in $\delta_1$, the apparent power due the term $\bar{V}_1 \bar{I}_{sup,G}^*$ will be constant since the magnitudes of $\bar{I}_{sup,G1}$ and $\bar{V}_1$ and their relative angle remains the same. The additional increase in injected power is therefore, in the present example, due to the current component represented by the sum of current contributions in (1). It is therefore apparent, that the point of maximum injectable power from $G_1$, occurs when the voltage $\bar{V}1$ (of constant magnitude) is aligned with the current phasor represented by the sum in (1).

By considering FIG. 2, it should be noted that the impedance that $G_1$ looks into, when all other points of constant voltage are shorted is the same as the Thevenin impedance between the node 1 and any of the other nodes of constant voltages, $\bar{Z}_{TH}$. Utilizing this, the current may be expressed as:

$$\bar{I}_{G_1} = \frac{\bar{V}_1}{\bar{Z}_{TH}} - \sum_{i=2}^{N} \frac{\bar{V}_{TH,Gi}}{\bar{Z}_{TH}} = \frac{\bar{V}_1}{\bar{Z}_{TH}} - \frac{\bar{V}_{TH}}{\bar{Z}_{TH}} \qquad (2)$$

where $\bar{V}_{TH} = \Sigma_{i=2}^{N} \bar{V}_{TH,Gi}$ and $\bar{V}_{TH,Gi}$ is the Thevenin voltage behind the Thevenin impedance which is used to determine the current due to the voltage source at node i. Utilizing that the maximum injectable power in this model occurs when the current contribution represented by the sum in (2) is aligned with $\bar{V}_1$, the maximum injectable power occurs when:

$$\arg\bar{V}_1 = \arg -\frac{\bar{V}_{TH}}{\bar{Z}_{TH}} \qquad (3)$$

If $\bar{V}_{TH}$ is used as phase angle reference, the above conditions for the point of maximum injectable power in the present model become:

$$\delta_1 = 180° - \phi_{TH} \qquad (4)$$

Where $\phi_{TH}$ is the angle of the system Thevenin impedance $\bar{Z}_{TH}$, so that the point of maximum injectable power into a two node system may occur when the phase angel difference between the two node voltages is equal to $180°-\phi$. The obtained expression in (4) means that the stability boundaries, derived for a simple two node or two bus system, may be applied to an arbitrary system. Thereby, the boundaries for aperiodic small signal stability of a given machine may be determined if the system Thevenin impedance, seen from the node of injection, and the corresponding injection impedance are known.

FIG. 3 shows how the stability boundary 16 for aperiodic small signal stability appears in the injection impedance plane 18. The boundary may be derived from the below expression $$Z_{inj} = -\frac{Z_{TH} \sin\theta}{\sin\phi_{TH}} \qquad (5)$$

The boundary thus appears as a circle in the Impendance plane and when $Z_{inj}$ equals the above expression, the circle has a radius of $r = Z_{TH}(2 \sin \phi_{TH})$. Operating the power system outside the circle, that is with an injection impedance larger than $Z_{TH}(2 \sin \phi_{TH})$ indicates a stable operating condition where a relative increase in the phase angle at the node of injection results in increased injection. An operation inside the circle that is with an injection impedance smaller than $Z_{TH}(2 \sin \phi_{TH})$ represents an unstable condition characterized in that in this condition, a decrease in the injected power will result in an increase of the phase angle at the node of injection. By utilizing (5), the aperiodic small signal stability of a given generator may therefore be described by the following set of inequalities, so that C is the criteria for stability for a given generator is $$C = \left| \frac{\bar{Z}_{inj} \cdot (2\sin\phi_{TH}) + j \cdot \bar{Z}_{TH}}{\bar{Z}_{TH}} \right| \begin{cases} > 1 & \text{Stable operation} \\ = 1 & \text{At the boundary} \\ < 1 & \text{Unstable operation} \end{cases} \qquad (6)$$

Based on the above analysis, a method for assessing the aperiodic small signal stability of the system generators may be outlined comprising the below sequence of steps for a system with K generators, and the generator number j indicating generators from 1 to K.:
Receive continuous sequences of system PMU-snapshots
For each generator, j=1:K: Determine the injection impedance $\bar{Z}_{inj,j}$ and determine the system Thevenin impedance $\bar{Z}_{TH,j}$; Apply (6) to assess the aperiodic small signal stability The above described method may determine, for a given generator, whether an increase in the voltage phase angle at the node of injection causes an increase in the injected power and therefore, the method may be suitable for detecting when the boundary for aperiodic small signal stability is crossed.

The method may further be used for determination of the margin from an observed operating point of the generator $G_i$ to the assessed boundary for generator $G_i$. The margin may for example indicate how much the phase angle $\delta_i$ may be increased before the boundary is reached while e.g. the phase angles at the remaining injection nodes are maintained at fixed angles in the calculations. It is an advantage that the margin is derived for a variation of a single variable, and not on the basis of a specific predetermined system stress pattern as previous continuation methods for determination of system stability margins suggest.

Figure 4:
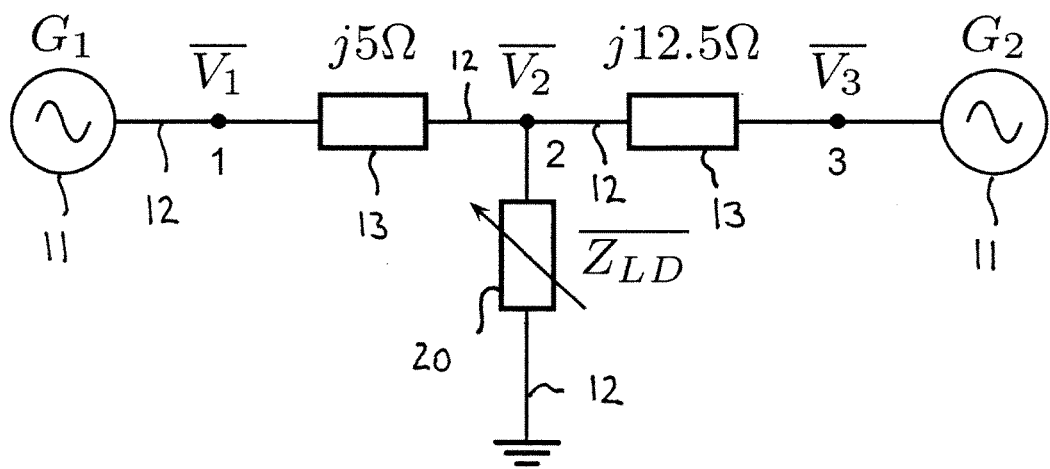
FIG. 4 shows a three node power system.

In FIG. 4, an exemplary power system is shown, and the following provides an exemplary assessment of the power system, such as an assessment of the aperiodic small signal instability. The system is shown to comprise three 20 kV nodes, 1, 2, 3, two generators, $G_1$ 11 and $G_2$ 11' and one load 20. Generator $G_2$ 11' at node 3 represents an infinite node where the voltage at node 3 in the present model is kept constant during the analysis. Generator $G_1$ 11 is a 50 MVA round rotor machine which is manually excited and operated with a constant mechanical power input. The dynamic model parameters for $G_1$ are provided in Table 1.

TABLE 1

Model parameters for $G_1$

| MVA: | 50 | $X_d$: | 2.54 |
|---|---|---|---|
| $T_{do}'$: | 3.00 | $X_q$: | 2.54 |
| $T_{do}''$: | 0.025 | $X_d'$: | 0.360 |
| $T_{qo}'$: | 2.00 | $X_q'$: | 0.468 |
| $T_{qo}''$: | 0.025 | $X_d''$: | 0.183 |
| H | 5.97 | $X_q''$: | 0.183 |
| D | 0.0 | $X_l$: | 0.10 |

TABLE 2

Initial conditions

| $\overline{V}_1$: | (20.00 ∠ −7.76°) kV |
|---|---|
| $\overline{V}_2$: | (18.53 ∠ −27.36°) kV |
| $\overline{V}_3$: | (20.00 ∠ 0°) kV |
| $P_{G1}$: | 24.87 MW |
| $P_{G2}$: | 13.63 MW |
| $P_{LD}$: | 38.50 MW |
| $Q_{LD}$: | 0.0 MVAr |

The initial conditions for the simulation are provided in table 2, where the load 20 is purely resistive of 38.5 MW and $G_1$ 11 produces 24.87 MW. In the following, a loss of synchronous operation of $G_1$ 11 is provoked by applying two minor disturbances in the form of two increases in load demand on node 2.

In the following, the system 21 in FIG. 4 is represented such that generator $G_1$ 11 is a source of constant voltage magnitude behind $X_d$, the voltage at the infinite node 3 is assumed constant and the load at node 2 is represented by its load impedance $\overline{Z}_{LD}$.

Since the steady state voltage magnitudes at the points of injections 11, 11' are assumed constant, all potential operating conditions (for the chosen manual excitation of the machine) may be determined from the value of the phase angle difference $\Delta\delta$ between the two nodes of constant voltage 11, 11' and the value of load impedance ($\overline{Z}_{LD} = R_{LD} + jX_{LD}$). That is, the constrained system has only three degrees of freedom ($\Delta\delta$, $R_{LD}$ and $X_{LD}$). If the load impedance is constrained to a fixed load angle, the system operating point can be described in terms of $\Delta\delta$ and the load impedance magnitude $Z_{LD}$.

In the following analysis, the load is purely resistive, $\phi=0°$, and the power injection from $G_1$ 11 into the fictive node of constant voltage 1 (behind $X_d$) is determined in respect to variations of $\Delta\delta$ and $Z_{LD}$.

Figure 5:
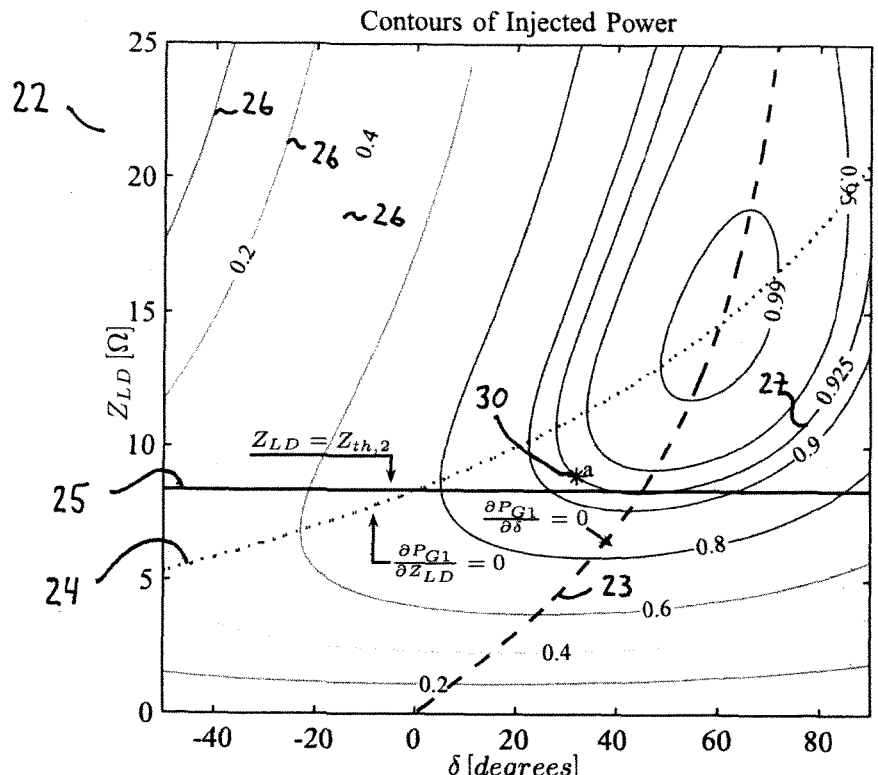
FIG. 5 shows contours of constant injected power in the $\delta$-$Z_{LD}$ plane for the Generator $G_1$ in FIG. 4.

FIG. 5 shows how the power injection from $G_1$ 11 varies as a function of these two variables. For simplicity, the infinite node 3 is chosen as angle reference, thus $\Delta\delta=\delta$ where $\delta$ is the angle of the voltage at the fictive node 1, behind $X_d$.

In FIG. 5 contours 26 of constant injected power in the $Z_{LD}-\delta$ plane 22 for generator $G_1$ 11 are shown. The contours 26 have been normalized in such way, that the value of maximum injectable power is used as per unit base. The initial conditions, from FIG. 4, are represented at the point a 30, which is on the contour 27 where P=0.925 pu (equivalent to $P_{G1}$=24.87 MW). FIG. 5 contains three characteristic lines: a dotted line 24 representing the conditions where the maximum injectable power for a fixed value of delta occur ($\partial P_{G1}/\partial Z_{LD}=0$), a dashed line 23 where the maximum amount of injectable power for a fixed value of $Z_{LD}$ occur ($\partial P_{G1}/\partial \delta=0$) and a straight line 25 representing where the load impedance $Z_{LD}$ is equal the magnitude of system Thevenin impedance, seen from the load at node 2 ($Z_{th,2}$).

In this study, the dashed line 23 where $\partial P_{G1}/\partial \delta=0$ is of interest. The line 23 represents the boundary of aperiodic small signal stability for machine $G_1$. An operation in the region to the right of the dashed line 23, for fixed $Z_{LD}$, is characterized by that an increase in $\delta$ causes a reduced injection of power into node 1. This means that a small increase of $\delta$ would lead to acceleration of the machine 11 due to mismatch between applied mechanical power and the generated electrical power causing further increase in the angle $\delta$. Since the machine acceleration increases with increasing $\delta$, an operation to the right of the dashed line 23 is unstable and would gradually cause $G_1$ 11 to lose synchronism with the infinite node 2.

In the example, the machine $G_1$ 11 is operated with a constant mechanical power input. This means that the contour 27 P=0.925 pu in FIG. 5 represents the trace of possible steady state operating points for changes in $Z_{LD}$. If the initial conditions are considered (point a 30 in FIG. 5), then a small decrease in the load impedance $Z_{LD}$ 20 (corresponds to increased load demand) results in a new steady state point, located on the contour P=0.925 pu, but closer to the boundary.

Figure 6:
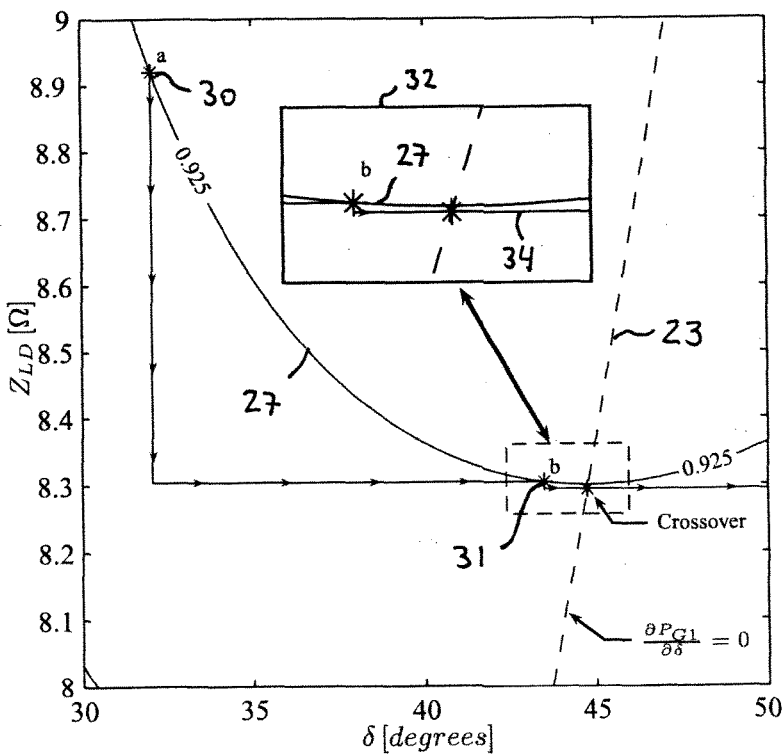
FIG. 6 shows an enlarged view of FIG. 5, FIGS. 7a-e show simulated results over time (seconds) where two disturbances are applied to the system in FIG. 4.

In the following time domain simulation, a loss of aperiodic small signal stability of $G_1$ 11 is provoked by applying two small step decreases in the load impedance $Z_{LD}$ 20. The effect of the two disturbances is illustrated in FIG. 6, which shows an enlarged view of the contour plot 22 in FIG. 5. In FIG. 6, the point a 30 represents the initial operating conditions. The first disturbance to be applied is a decrease in $Z_{LD}$ 20 from 8.9210Ω to 8.3039Ω which results in that $G_1$ 11 will approach a new equilibrium represented by the point b 31. The post-disturbance equilibrium at point b 31 is stable, but very close to the stability boundary 23. The second disturbance applied, is the very small decrease in $Z_{LD}$ 20 from 8.3039Ω to 8.2936Ω which results in the loss of aperiodic small signal stability of machine $G_1$ 11. The effect of the disturbance can be seen by considering the box containing an enlarged view 32 of the region close to point b 31. It can be seen that the contour of constant $P_{G1}$ 27 and the line 34 representing new value of $Z_{LD}$ 20 do not intersect following the second disturbance, which results in that no equilibrium can be obtained and consequently the machine 11 eventually looses synchronism.

The time domain simulation was carried out in PSS/E (version 30) where the initial conditions from FIG. 3 and previously mentioned disturbances of the load 20 were applied to provoke an aperiodic small signal instability.

Figure 7A:
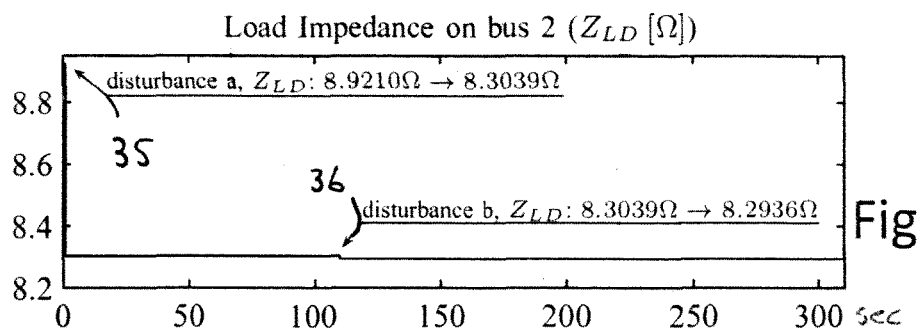
FIG. 7a shows the disturbances applied on node 2 ($Z_{LD}$)
Figure 7B:
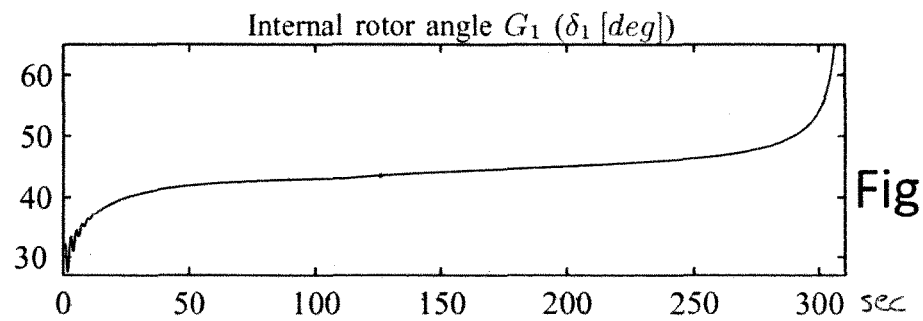
FIG. 7b shows the internal rotor angle of $G_1$, FIG. 7c the active power output from the machine $G_1(P_{G1})$.
Figure 7C:
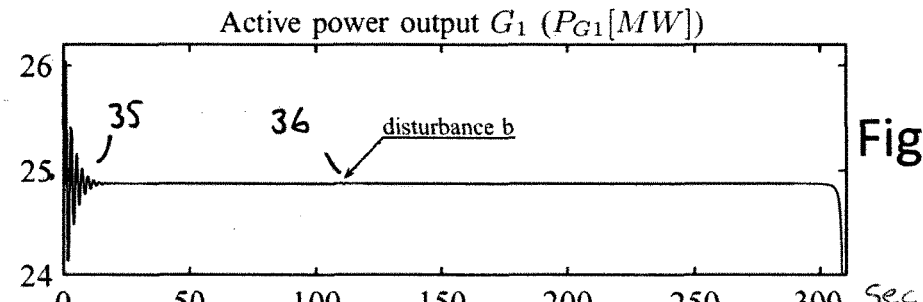
FIG. 7d shows an enlarged view of FIG. 7c.
In FIG. 7e is the node voltage magnitudes for each of the nodes 1, 2 and 3 shown.
Figure 7D:
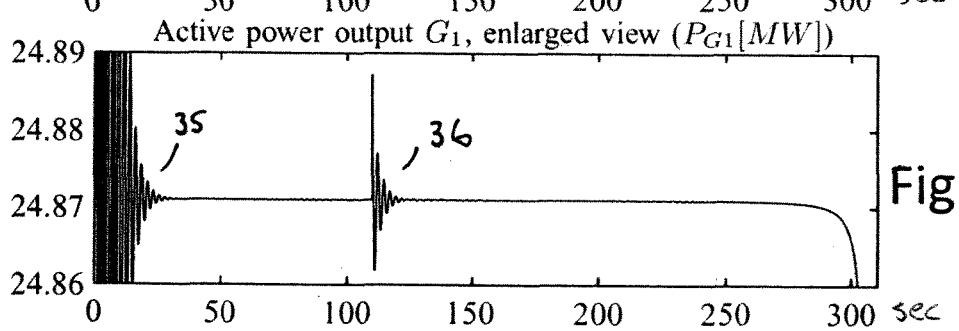
Figure 7E:
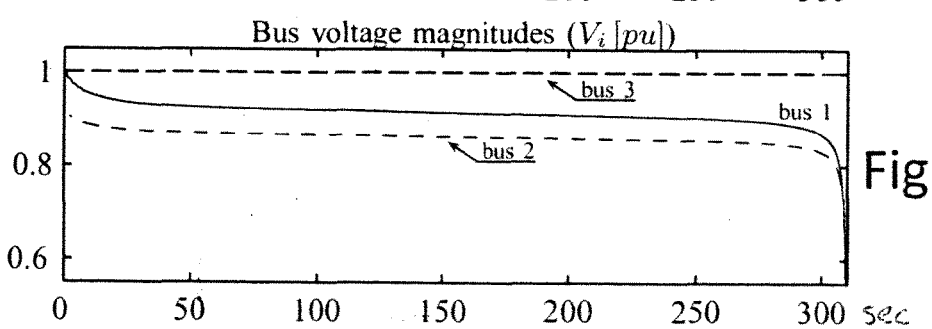

The results from the time domain simulation are shown in FIG. 7a-e. FIG. 7a shows the applied changes in the load impedance 20 that eventually caused the system instability. FIG. 7b shows the internal rotor angle of G1 11, FIG. 7c shows the active power output from machine $G_1$ 11, with FIG. 7d showing an enlarged view active power output from $G_1$ 11, and FIG. 7e shows the bus voltage magnitudes. Disturbance a 35 brings machine $G_1$ very close to its stability boundaries, whereafter the very small disturbance b 36, causes eventual loss of rotor angle stability.

The first disturbance 35 was applied at t=1 s where the load impedance 20 was changed from 8.9210Ω to 8.3039Ω. The second disturbance 36 was applied at the time t=110 s where the impedance 20 was changed from 8.3039Ω to 8.2936Ω. It can be seen from FIGS. 7b-e that approximately 200 s passed from the second disturbance 36 until very sudden decrease in the system voltages occurred.

FIG. 7b shows the internal rotor angle $\delta_1$ of $G_1$ 11 where the infinite node 2 is used as angle reference. When the second disturbance 36 is applied at t=110 s, a slow increase in the rotor angle was experienced over a period of approximately 200 s until a very sharp increase in the rotor angle occurred at t=300 s.

FIG. 7c and FIG. 7d show the power output $P_{G1}$ from $G_1$ 11. FIG. 7d provides an enlarged view of the plot in FIG. 7c, in that the y-axis is shown from $P_{G1}$=24.86 MW to 24.89 MW in FIG. 7d. The second disturbance 36 may barely be seen in FIG. 7c, but yet, it is sufficient to cause $G_1$ 11 to lose its synchronous operation. In FIG. 7d, the size of the second disturbance 36 may be more clearly seen. It is worth noticing, that the power output from $G_1$ 11 was substantially constant following the second disturbance 36 until the sudden sharp decrease in the power output occurred at t=300 s (approx). The emerging stability problems of $G_1$ 11 are not reflected in the power output from the machine and could therefore not have been identified from observations the active power output from $G_1$, i.e. $P_{G1}$, alone.

FIG. 7e shows the node voltage magnitudes in the system. Following the first and second disturbances, the node voltages on nodes 1 and 2 appear to be very slowly decreasing until the very sharp decrease occurs. As seen, the disturbance "a" 35 brings machine $G_1$ very close to its stability boundaries, where after the very small disturbance "b" 36 causes eventual loss of rotor angle stability.

Figure 8A:
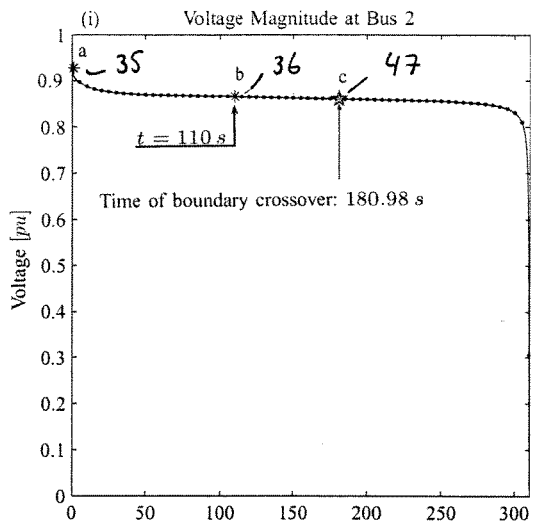
FIGS. 8a-d show test results according to an embodiment of the invention, in that FIG. 8a shows the voltage magnitude at node 2.

In FIGS. 8a-d, the test results are provided. FIG. 8a shows a time domain plot of the voltage magnitude at node 2, where the two disturbances 35, 36 are seen, and the time when the boundaries are crossed is seen at c 47. The dots on the plotted line are used to illustrate a fixed interval of time where the distance between two adjacent dots represents Δt=5s. The time of the detected instability occurred approximately 71 s after the second disturbance 36 had been applied. The total time elapsed from the detection of the boundary crossover until the very sharp decline in voltage magnitude occurred, is seen to be approximatley 130 s.

Figure 8B:
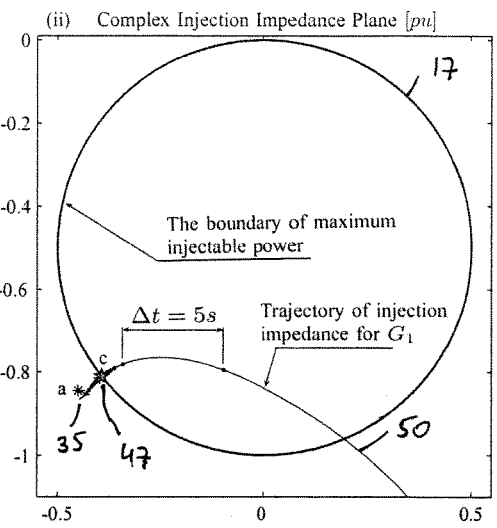
Figure 8C:
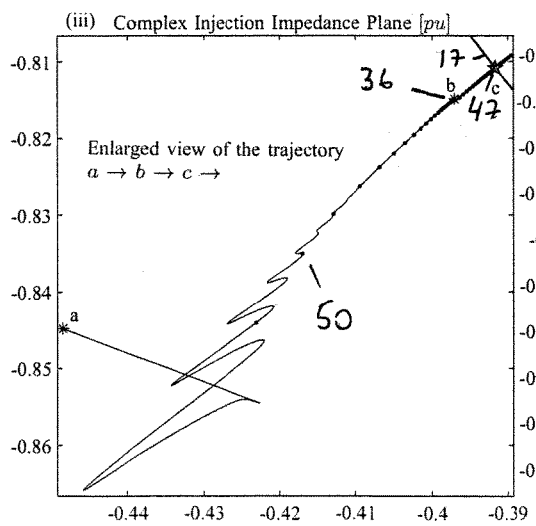
Figure 8D:
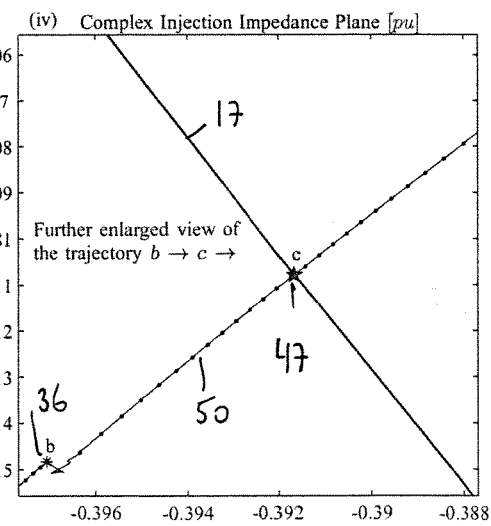

FIGS. 8b-8d show the development in the complex injection Impedance plane, where a trajectory 50 of the injection impedance $Z_{inj}$ for generator $G_1$ 11 is indicated. The injection impedance values $Z_x$ are normalized in such way that the stability boundary has a diameter at unity at any instance of time.

The time domain simulation was carried out in such way that values of line flows and node voltages were stored in a output file for every 20 ms of the simulated time interval. The output data was used to generate synthetic PMU-measurements of voltage and current phasors. In that way, a snapshot of the system operating conditions or a present state of the power system for every 20 ms was obtained or determined.

The synthetic PMU-data was used in the assessment method, to determine the value of the injection impedance $Z_{inj}$ for $G_1$ 11 and the value of the system line and load impedances 20. With all network impedances known, the system Thevenin impedance $Z_{TH}$, as seen from the point of injection, i.e. node 1, may be determined as discussed above. The value of $Z_{inj}$ and $Z_{TH}$ is determined for every PMU-snapshot and it is investigated when the stability boundaries, represented by (5), are crossed.

FIGS. 8b-d show all the same trajectory 50 of the injection impedance $Z_{inj}$, but in different level of detail. The value of the injection impedance is normalized in such way that the stability boundary 17, at any instant of time, always appears as a circle with a diameter at unity. In FIG. 8b, the trajectory of the injection impedance $Z_{inj}$ may be seen for nearly the whole time interval as shown in FIG. 8a. The initial conditions at point a 45 are quite close to the stability boundary 17, and when the disturbances 35, 36 are applied, the trajectory 50 slowly moves towards the stability boundary 17. The stability boundary 17 is crossed at point c 47 where after the machine 11 gradually accelerates and looses synchronism with the infinite node 2.

FIG. 8c shows an enlarged view of the trajectory 50 from a 45 through b 46 to c 48 in the complex injection impedance plane. It may be seen that the system 21 gradually approaches the operating point b 46 following the first disturbance 35 where the distance between two dots (that denote time interval of 5s) gradually gets shorter and shorter. A gradual decrease in the distance between two points indicates that the machine 11 is gradually decelerating and approaching an equilibrium point and a synchronous speed.

FIG. 8d provides a further enlarged view of the injection impedance trajectory 50 from the occurrence of the second, very small disturbance 36, and until after the boundary 17 was crossed. If the trajectory 50 from b 46 to c 47 is studied, it may be seen that the disturbance 36 initially caused increase in the average angular velocity of the machine 11, which is reflected by a gradual movement of the system operating point towards the boundary. As the operating point moves closer to the boundary 17 from b 46 towards c 47, the distance between adjacent dots is gradually decreasing, which indicates that machine is slowly decelerating towards synchronous speed during that period. However, when the boundary 17 is crossed at c 47, it may be seen that the distance between the dots is gradually increasing. This indicates that the machine 11 is accelerating, which is expected behavior when the boundary for aperiodic small signal instability has been crossed.

It is thus seen from the test results in FIGS. 8a-d that the suggested assessment method accurately detects, for the studied system, when the boundary of aperiodic small signal stability is crossed.

Furthermore, the time it takes from when the stability boundary is crossed at 47 until the sharp decline 43 in the voltage magnitude occurs may be seen from the figures. During this time interval, the machine is slowly but gradually accelerating, yet as can be seen from the figures, it is very hard to identify that the machine 11 is in an unstable mode merely by inspecting the plots of the system voltage magnitude and power output in FIGS. 7a-e.

In the following exemplary equations are derived which may describe the mapping of critical boundaries and characteristic lines relating to power, P, power injection Q and voltage V from the three dimensional PQV-surface into the two-dimensional injection impedance plane (load impedance plane for both positive and negative resistance). The expressions derived for the critical and characteristic lines in the impedance plane may be used in the method as set out above and may thus form the basis for the assessment method according to the present invention, wherein phasor measurements may be used to provide a situational awareness. Thereby critical operational boundaries may be obtained in real time and furthermore, the system operating conditions may be visualized in an informative way. Below, the derivations of some system characteristics in the injection (or load) impedance plane are determined and the critical lines from the PQV-surface may be mapped into the impedance plane representing conditions where the partial derivatives of the variables P, Q and V in respect to each other become zero. Some additional characteristic lines may be mapped into the impedance plane as well. These may include the mapping of the lines of constant P, Q, V and δ from the PQV-surface into the impedance plane. All of the mapped critical and characteristic lines appear as circles in the impedance plane.

It may be useful to express critical system boundaries in terms of measurable system quantities, such as system injection impedances where the term injection impedance is used to denote a load impedance where the resistive part can be positive or negative. By expressing the system boundaries in the injection impedance plane, real time measurements of the injection impedances may be compared to the boundaries, hence providing an assessment of the system stability.

Figure 9:
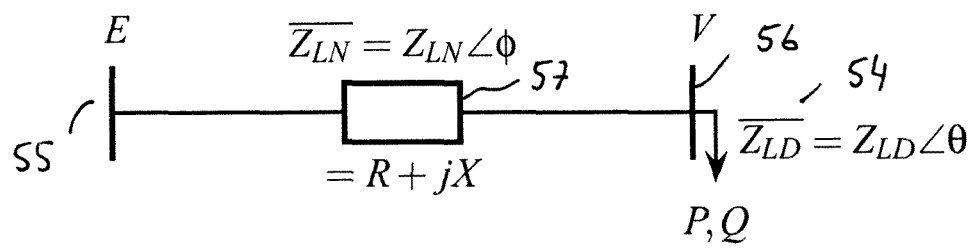
FIG. 9 shows a diagram of a two node system.

FIG. 9 shows a simple two bus system for which analytically derived mappings of some useful characteristics of a three dimensional PQV-surface into the injection impedance plane may be obtained. The derived expressions for the characteristic boundaries may be used as foundations for the method of assessing the power system as disclosed above.

The diagram of the two bus system as shown in FIG. 9 also provides the notations for the system variables which are used in the following. At 55 E is the sending end voltage magnitude, V at 56 is the receiving end voltage magnitude, P and Q are active and reactive power at the receiving end. $Z_{LN}=R+jX$ at 57 represents the line impedance and $Z_{LD}=Z_{LD}\angle\theta$ at 54 represents the injection impedance.

The relationship between receiving and sending voltage, active and reactive power may be expressed as:

$$V^4 + V^2(2(RP+XQ)-E^2) + (R^2+X^2)(P^2+Q^2) = 0 \quad (7)$$

In order to construct a PQV-surface, a solution for either P,Q are V has to be found. Rearranging (1) and solving for P results in the following two solutions:

$$P_{[1]} = -\frac{RV^2 - \sqrt{-Q^2(R^2+X^2)^2 + (R^2+X^2)(E^2-2QX)V^2 - X^2V^4}}{R^2+X^2} \quad (8)$$

$$P_{[2]} = -\frac{RV^2 + \sqrt{-Q^2(R^2+X^2)^2 + (R^2+X^2)(E^2-2QX)V^2 - X^2V^4}}{R^2+X^2} \quad (9)$$

By constraining the real and imaginary part of the line impedance $Z_{LN}$, R and X, such that R≥0 and X>0, then the solution $P_{[2]}$ corresponds to a solution where the active power at the receiving end 56 P is negative while $P_{[1]}$ describes the solutions for P values that may be positive as well as negative. All solutions for positive values of P are therefore described by $P_{[1]}$, given the above constrains for R and X.

The two solutions $P_{[1]}$ and $P_{[2]}$ may describe the entire PQV-surface. If a region S is defined containing all points on the PQV-surface and subregions $S_1$ and $S_2$ are defined containing the solutions of $P_{[1]}$ and $P_{[2]}$ respectively, then $S = S_1 \cup S_2$ is valid.

Solutions for Q and V, may also be obtained by manipulating (7):

$$Q_{[1]} = -\frac{XV^2 + \sqrt{-P^2(R^2+X^2)^2 + (R^2+X^2)(E^2-2RP)V^2 - R^2V^4}}{R^2+X^2} \quad (10)$$

$$Q_{[2]} = -\frac{XV^2 - \sqrt{-P^2(R^2+X^2)^2 + (R^2+X^2)(E^2-2RP)V^2 - R^2V^2}}{R^2+X^2} \quad (11)$$

$$V_{[1]} = \sqrt{-(RP+XQ) + \frac{E^2}{2} + \sqrt{\frac{E^2}{4} - (XP-RQ)^2 - E^2(RP+XQ)}} \quad (12)$$

$$V_{[2]} = \sqrt{-(RP+XQ) + \frac{E^2}{2} - \sqrt{\frac{E^4}{4} - (XP-RQ)^2 - E^2(RP+XQ)}} \quad (13)$$

$$V_{[3-4]} = -\sqrt{-(RP+XQ) + \frac{E^2}{2} \pm \sqrt{\frac{E^4}{4} - (XP-RQ)^2 - E^2(RP+XQ)}} \quad (14)$$

It may be seen that two different solutions exists for the reactive power Q and four solutions for the voltage V. $V_{[3-4]}$ provide negative values for V which has no physical meaning and therefore, only solutions for positive values for V are of interest ($V_{[1-2]}$), In the following, the regions $S_3$ and $S_4$ represent the set of points described by the solutions $Q_{[1]}$ and $Q_{[2]}$, respectively and the regions $S_5$ and $S_6$ represent the set of points described by the solutions $V_{[1]}$ and $V_{[2]}$, respectively. Similarly as above, the equalities $S = S_3 \cup S_4 = S_5 \cup S_6$ are valid.

Figure 10A:
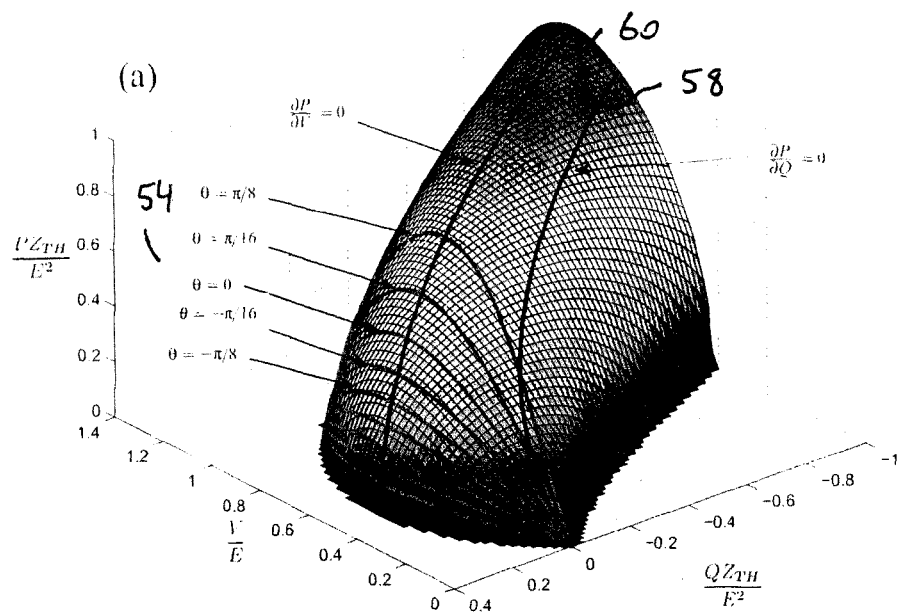
FIGS. 10a-b illustrate the relationship between P, Q and V when the sending end voltage is constant and the line parameters are fixed.
Figure 10B:
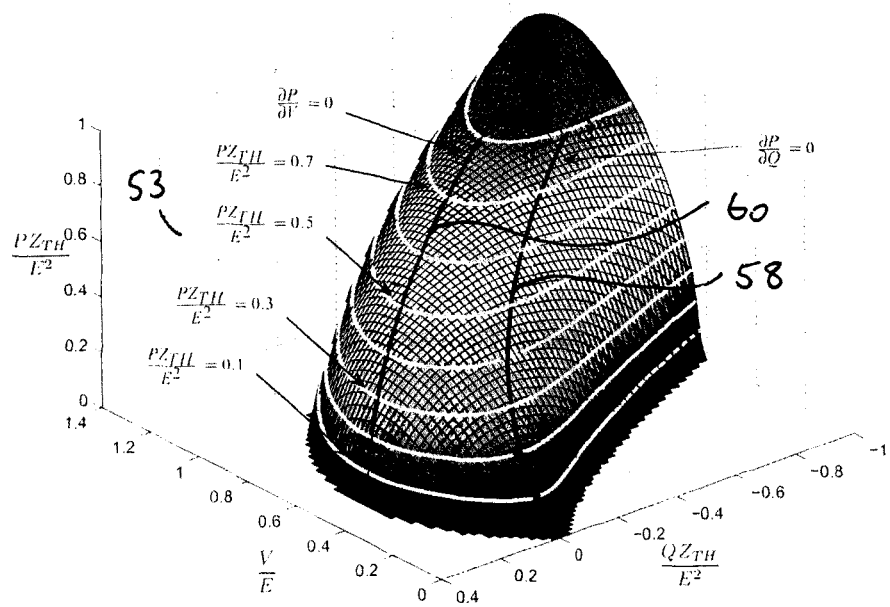

The relationship between P,Q and V may be visualized as a three dimensional surface by utilizing one of the expressions provided in (8)-(13). FIGS. 10a-b show such surfaces where the values E=1, X=0.1 and R=0.01 are used. The surfaces are shown for positive values of the active power P.

In FIG. 10a, several lines 54 on the surface are shown that represent a constant load power factor for different values of load angle θ, i.e. θ=π./8; π/16; 0; −π/8; −π/16 A projection of those lines onto the PV-plane results in the traditional nose curves (PV-curves), often used for voltage stability analysis. FIG. 10b shows lines 53 of constant receiving end power P.

Figure 11A:
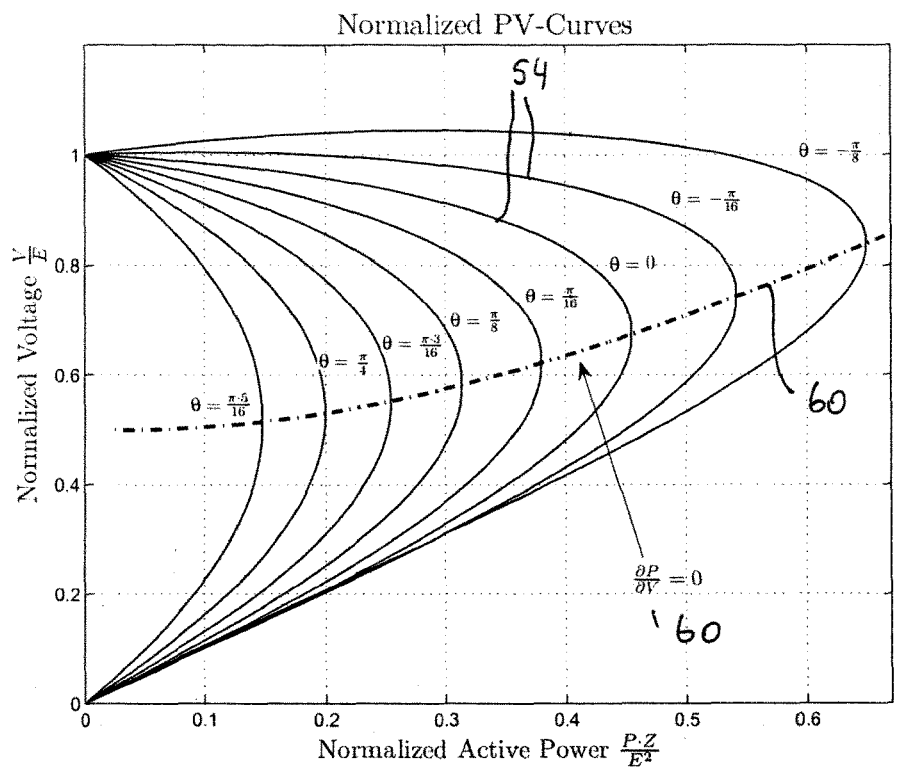
FIGS. 11a-b show the result of the projection of the lines of constant power factor in FIG. 10 onto a) the PV plane and b) the QV-plane.
Figure 11B:
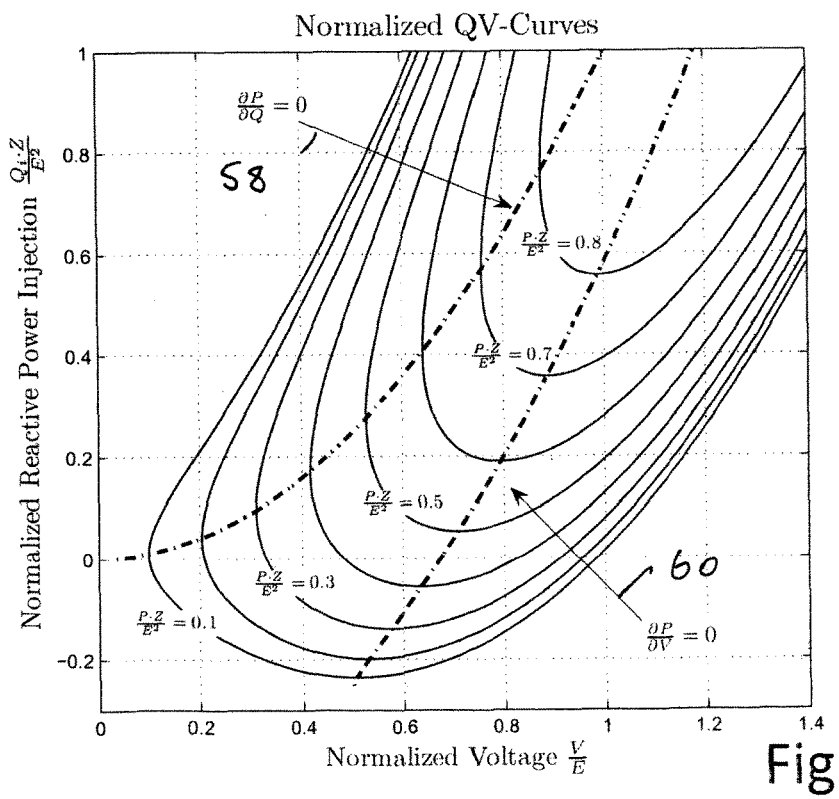

In FIG. 11a, a projection of the lines from FIG. 10a onto the QV-plane is shown, resulting in the QV-curves, that is lines of constant power factor, commonly used for voltage stability analysis. In FIG. 11b, a projection of the lines from FIG. 10b is shown, resulting in PQ-curves, that is lines of constant power, for the surfaces in FIG. 10b.

Apart from the lines of constant power factor and constant power, two lines that may also be of importance for stability studies are shown. The first line, the one which intercepts the lines of constant power factor when P is at maximum, is the line 60 where the partial derivative $$\frac{\partial P}{\partial V}$$

is zero. The second line 58 represents the set of points where $$\frac{\partial P}{\partial Q} = 0.$$

Both of these lines 58, 60 may represent the limits for maximum deliverable power P for a given system condition. The line 60, $$\frac{\partial P}{\partial V} = 0$$

represents the maximum deliverable power when the sending end voltage is fixed and the relationship between P and Q is linear (that is changes in P are proportional to changes in Q). This furthermore represents a maximum deliverable power when the value reactive power Q is maintained at a fixed value.

The line 58

$$\frac{\partial P}{\partial Q} = 0$$

represents the maximum deliverable power when the receiving end voltage V is fixed. The line 58 may be used as boundary for the maximum deliverable power between to systems, where the voltage in each end is maintained constant. This boundary may be of interest for rotor angle stability since the boundary represents the maximum injectable power a source of constant voltage may inject into the system. The line 60 where $$\frac{\partial P}{\partial V} = 0$$

represents the situation when the maximum deliverable power P to the load is reached for a fixed load factor and may be of interest in voltage stability studies.

In relation to the development of real time stability assessment methods, it may be of interest to monitor the instantaneous operating point and to determine its distance from the critical boundaries where the partial derivatives in FIGS. 11a-b become zero. It may not be convenient to monitor multiple operating points on a PQV-surface, since the shape of PQV-surface is dependent on the value of $\overline{Z}_{LN}$ for each operating point. A mapping of the main characteristics of the PQV-surface into the injection impedance plane may enable the monitoring of multiple operating points since it enables normalization of the monitored operating points in such way that the same critical boundaries apply to all points. In the following some equalities are identified that may enable an analytical derivation those lines 58, 60.

A preferred background for the mapping of the critical lines of the PQV-surface into the injection impedance plane, the following relationship are preconditions:

$$\text{When } \frac{\partial P}{\partial V} = 0, \text{ then } \frac{\partial Q}{\partial V} = 0. \tag{15}$$

$$\text{When } \frac{\partial P}{\partial Q} = 0, \text{ then } \frac{\partial V}{\partial Q} = 0. \tag{16}$$

$$\text{When } \frac{\partial Q}{\partial P} = 0, \text{ then } \frac{\partial V}{\partial P} = 0. \tag{17}$$

In the following subsections, it will be shown that the statements above are valid.

In the following, it is proved that when $\partial P/\partial V=0$ then $\partial Q/\partial V=0$ Differentiating the expression for $P_{[1]}$ in (8) with respect to V yields:

$$\frac{\partial P}{\partial V} = -\frac{2RV}{R^2 + X^2} + \frac{V(E^2 - 2QX)(R^2 + X^2) - 2X^2V^3}{(R^2 + X^2)\sqrt{\begin{array}{c}-Q^2(R^2 + X^2)^2 + \\ (R^2 + X^2)(E^2 - 2QX)V^2 - X^2V^4\end{array}}} \tag{18}$$

Setting $$\frac{\partial P}{\partial V} = 0$$

and solving for Q results in:

$$Q_{(\partial P\partial V=0)} = \frac{X(E^2 - 2V^2) \pm ER\sqrt{4V^2 - E^2}}{2(R^2 + X^2)} \tag{19}$$

By using $P_{[2]}$ instead of $P_{[1]}$, when determining the partial derivative in (18), leads to the same expression for Q as in (19). The result in (19) reveals two solutions for Q, which describe the line where $\partial P/\partial V=0$.

It can be seen that (19) is valid for V in the range $[E/2,\infty[$. A description of the entire PQV-surface may be obtained from equations 2 and 3, which correspond to the subregions $S_1$ and $S_2$ respectively. Inspection of (19) reveals that the solution with the negative sign lays entirely in the region $S_1$ while the solution with the positive sign lays partially in $S_1$ and $S_2$. The values of $Q_{(\partial P/\partial V=0)}$ obtained by the solution with the positive sign should be applied into $P_{[1]}$ when the voltage V is in the range $[E/2,E/(2 \sin \phi)]$ and applied into $P_{[2]}$ when V is in the range $$[\frac{E}{2}\sin\phi, \infty[. \text{ If the values of } Q_{(\partial P\partial V=0)}$$

are not applied in $P_{[1]}$ and $P_{[2]}$ as described, then they do not represent the set of points on the PQV-surface where $\partial P/\partial V=0$.

The aim is to show that when $$\frac{\partial P}{\partial V} = 0 \text{ then } \frac{\partial P}{\partial V} = 0.$$

Differentiation of the expression for $Q_{[1]}$ in (10) in respect to V results in:

$$\frac{\partial Q}{\partial V} = -\frac{2XV}{R^2 + X^2} - \frac{V(E^2 - 2PR)(R^2 + X^2) - 2R^2V^3}{(R^2 + X^2)\sqrt{\begin{array}{c}-P^2(R^2 + X^2)^2 + (R^2 + X^2) \\ (E^2 - 2PR)V^2 - R^2V^4\end{array}}} \quad (20)$$

Setting $\partial Q/\partial V=0$ and solving for P results in:

$$P_{(\partial Q \partial V=0)} = \frac{R(E^2 - 2V^2) \pm EX\sqrt{4V^2 - E^2}}{2(R^2 + X^2)} \quad (21)$$

The results are the same as the one that would be obtained if $Q_{[2]}$ would have been used instead of $Q_{[1]}$ in (20).

An analysis of the two solutions for $P_{(\partial Q \partial V=0)}$ reveals that the expression is valid for V in the range $[E/2,\infty[$.

By inspection of the solutions for (21), it may be seen that the solution with the positive sign lays entirely in the region $S_1$ while the solution with the positive sign lays partially in $S_1$ and $S_2$. The values of $P_{(\partial Q \partial V=0)}$ obtained by the solution with the negative sign represent points in $S_1$ when the voltage V is in the range $[E/2,E/(2 \sin \phi)]$ and represent points in $S_2$ when V is in the range $[E/(2 \sin \phi),\infty[$.

By constraining expression for $P_{[1]}$ in (8) by inserting the expression with the positive sign for $Q_{(\partial P \partial V=0)}$ in (19) (which lays entirely in $S_1$) gives:

$$P = \frac{-2RV^2 + \sqrt{\begin{array}{c}2XE^2\sqrt{R^2E^2(2V-E)(2V+E)} + \\ E^4R^2 + 4X^2V^2E^2 - X^2E^4\end{array}}}{2(R^2 + X^2)} \quad (22)$$

$$= \frac{-2RV^2 + E\sqrt{\left(RE + X\sqrt{(2V-E)(2V+E)}\right)^2}}{2(R^2 + X^2)}$$

$$= \frac{R(E^2 - 2V^2) + EX\sqrt{4V^2 - E^2}}{2(R^2 + X^2)}$$

The above expression for P, which is constrained by $\partial P/\partial V=0$, is the same as the expression for P with the positive sign in (21) where $\partial Q/\partial V=0$. It is therefore proven that the line on the surface where $\partial Q/\partial V=0$ is the same line as the one where $\partial P/\partial V=0$ in the present calculation.

In the following, it is proved that when $\partial P/\partial Q=0$ then also $\partial V/\partial Q=0$.

Differentiation of the expression for $P_{[1]}$ in (8) with respect to Q yields:

$$\frac{\partial P}{\partial Q} = \frac{-Q(R^2 + X^2) - XV^2}{\sqrt{-Q^2(R^2 + X^2)^2 + (R^2 + X^2)(E^2 - 2QX)V^2 - X^2V^4}} \quad (23)$$

Setting $\partial P/\partial Q=0$ and solving for Q yields:

$$Q_{(\partial P \partial Q=0)} = -\frac{XV^2}{R^2 + X^2} \quad (24)$$

This result could be obtained also if $P_{[2]}$ is differentiated in (23) instead of $P_{[1]}$. By inspecting the expressions for $Q_{[1]}$ and $Q_{[2]}$ in (10) and (11), it may be seen that the expression for $Q_{(\partial P \partial Q=0)}$ is identical to $Q_{[1]}$ and $Q_{[2]}$ when the term under the root equals zero. This infers that the line representing $\partial P \partial Q=0$ is at the boundary of regions described by $Q_{[1]}$ and $Q_{[2]}$ ($S_3$ and $S_4$ respectively). Therefore, the expression for $Q_{(\partial P \partial Q=0)}$ represents the intersection between $Q_{[1]}$ and $Q_{[2]}$ ($Q_{(\partial P \partial Q=0)}=S_3 \cap S_4$). Therefore (24) is valid for all values of V in both expressions of $Q_{[1]}$ and $Q_{[2]}$ in (10) and (11) respectively.

The aim of this subsection is to show that when $\partial P/\partial Q=0$ then $\partial P/\partial Q=0$. Expressions for the positive voltage magnitudes ($V_{[1]}$ and $V_{[2]}$) were derived in (12) and (13). Differentiation of the expression for $V_{[1]}$ in respect to Q yields:

$$\frac{\partial V}{\partial Q} = \frac{2R(XP - RQ) - E^2X - X\sqrt{d}}{\sqrt{2d\sqrt{d} + 2d(E^2 - 2(RP + QX))}} \quad (25)$$

Where $d=-4(RQ-XP)^2+E^2(E^2-4(RP+QX))$. Setting $\partial V/\partial Q=0$ and solving for P results in:

$$P_{(\partial V \partial Q=0)} = \frac{RQ \pm E\sqrt{-QX}}{X} \quad (26)$$

This expression would have been obtained also, if any one of the four solutions for the voltages ($V_{[1-4]}$ in (12)-(14)) would have been differentiated in (25) and used to determine $P_{(\partial V \partial Q=0)}$. Equation (26) is valid for negative Q when X is positive (inductive) and vice versa.

To show that $\partial P/\partial Q=0$ and $\partial P/\partial Q=0$ are the same, the expression for $Q_{(\partial P \partial Q=0)}$ from (24) is inserted into the expression for $P_{[1]}$ given by (8). By doing so, the result is:

$$P_{[1]} = \frac{\left(-RV + \sqrt{R^2E^2 + X^2E^2}\right)V}{R^2 + X^2} \quad (27)$$

This expression may also be achieved by inserting $Q_{(\partial P \partial Q=0)}$ from (24) into the expression for $P_{(\partial V \partial Q=0)}$ with the positive sign given by (26):

$$P_{(\partial V \partial Q=0)} = \frac{RQ_{(\partial P \partial Q=0)} + E\sqrt{-Q_{(\partial P \partial Q=0)}X}}{X} \quad (28)$$

$$= \frac{\left(-RV + \sqrt{R^2E^2 + X^2E^2}\right)V}{R^2 + X^2}$$

Since the same result is obtained by constraining the surface described by $P_{[1]}$ with $Q_{(\partial P \partial Q=0)}$ as by constraining the line described by $P_{(\partial V \partial Q=0)}$ with $Q_{(\partial P \partial Q=0)}$, it is proven that the line on the surface where $\partial V/\partial Q=0$ is the same as line where $\partial P/\partial Q=0$ in the present calculation.

In the following, it is proved that when $\partial Q/\partial P=0$ then $\partial V/\partial P=0$ Differentiation of the expression for $Q_{[1]}$ in (10) with respect to P yields:

$$\frac{\partial Q}{\partial P} = \frac{RV^2 + P(R^2 + X^2)}{\sqrt{-P^2(R^2 + X^2)^2 + (V^2E^2 - 2V^2RP)(R^2 + X^2) - R^2V^4}} \quad (29)$$

Rearranging and solving for P, when $$\frac{\partial Q}{\partial P} = 0$$

results in:

$$P_{(\partial Q \partial P=0)} = -\frac{RV^2}{R^2 + X^2} \tag{30}$$

This is the same result as would have been obtained if $Q_{[2]}$ in (11) would have been differentiated in (29) instead of $Q_{[1]}$. By inspection of equations (8) and (9) for $P_{[1]}$ and $P_{[2]}$ respectively, it may be seen that $P_{(\partial Q \partial P=0)}$ is identical to $P_{[1]}$ and $P_{[2]}$ when the term under the root is equal zero. This means that the line representing $\partial Q/\partial P=0$ at the boundaries of $P_{[1]}$ and $P_{[2]}$ ($\partial Q/\partial P=0$ at $S_1 \cap S_2$). Therefore (30) is valid for all values of V in either $P_{[1]}$ or $P_{[2]}$.

The aim is to show that when $\partial Q/\partial P=0$ then $\partial V/\partial P=0$. Differentiating the expression for $V_{[1]}$ in (12) in respect to P yields:

$$\frac{\partial V}{\partial P} = \frac{2X(RQ - XP) - E^2 R - R\sqrt{d}}{\sqrt{2d\sqrt{d}} + 2d(E^2 - 2(RP + QX))} \tag{31}$$

where $d = -4(RP-QX)^2 + E^2(E^2 - 4(RP+QX))$.

Rearranging and solving for Q, when $$\frac{\partial V}{\partial P} = 0$$

results in:

$$Q_{(\partial V \partial P=0)} = \frac{PX \pm E\sqrt{-RP}}{R} \tag{32}$$

If any one of the four solutions for the voltages ($V_{[1-4]}$ in (12)-(14)) would have been differentiated in (31) and used to determine $Q_{(\partial V \partial P=0)}$, the same expression is obtained. Equation (32) is valid for negative P if R is positive and vice versa. Inserting the expression for $P_{(\partial Q \partial P=0)}$ from (30) into the expressions for $Q_{[1]}$ and $Q_{[2]}$ in (10-11) yields:

$$Q_{[1]} = -\frac{XV^2 + EV\sqrt{R^2 + X^2}}{R^2 + X^2} \tag{33}$$

$$Q_{[2]} = -\frac{XV^2 - EV\sqrt{R^2 + X^2}}{R^2 + X^2} \tag{34}$$

Same results could be obtained if the expression for $Q_{(\partial V \partial P=0)}$ in (32) would have been constrained by inserting $P_{(\partial Q \partial P=0)}$ from (30). This proves that the line on the PQV-surface where $\partial Q/\partial P=0$ is the same as the line where $\partial V/\partial P=0$ in the present calculation.

In the following sections the lines on the PQV-surface, that represents the set of points where the partial derivatives become zero, become transformed into the injection impedance plane.

Firstly, the line that represents $\partial P/\partial Q = \partial V/\partial Q = 0$ is transformed into the RX plane. By writing the expression for $Q_{(\partial P \partial Q=0)}$ from (24) in terms of apparent injection impedance $Z_{LD}$ results in:

$$Q_{(\partial P \partial Q=0)} = -\frac{XV^2}{R^2 + X^2} = \frac{V^2 \sin\theta}{Z_{LD}} \tag{35}$$

and solving for $Z_{LD}$ results in:

$$Z_{LD} = -\frac{Z_{LN}\sin\theta}{\sin\phi} \tag{36}$$

From (36), it may be seen that the line that represents $\partial P/\partial Q = \partial P/\partial Q = 0$ is mapped as a circle in the RX-plane. The circle intercepts the origin of the plane, the complex conjugate of the line impedance and the negative of the line impedance. That is, the line where $\partial P/\partial Q = \partial P/\partial Q = 0$ appears as a circle with center in the impedance plane at ($R_{LD}=0$, $X_{LD}=-r$) where r is the radius of the circle and may be expressed as:

$$r = \frac{Z_{LN}}{2\sin\phi} \tag{37}$$

In the following, the line that represents $\partial Q/\partial P = \partial V/\partial P = 0$ is transformed into RX-plane. By writing the expression for $P_{(\partial Q/\partial P=0)}$ where $\partial Q/\partial P = \partial V/\partial P = 0$ from (30) in terms of apparent injection impedance $Z_{LD}$ results in:

$$P = -\frac{RV^2}{R^2 + X^2} = \frac{V^2 \cos\theta}{Z_{LD}} \tag{38}$$

and solving for $Z_{LD}$ yields:

$$Z_{LD} = -\frac{Z_{LN}\cos\theta}{\cos\phi} \tag{39}$$

From (39) it can be seen that the line that represents $\partial Q/\partial P = \partial V/\partial P = 0$ is mapped as a circle in the RX-plane. The circle intercepts the origin of the plane, the real conjugate of the line impedance and the negative of the line impedance. That is, the line where $\partial Q/\partial P = \partial V/\partial P = 0$ appears as a circle with center in the impedance plane at ($R_{LD}=-r$, $X_{LD}=0$) where r is the radius of the circle and may be expressed as:

$$r = \frac{Z_{LN}}{2\cos\phi} \tag{40}$$

In the following the line that represents $\partial P/\partial V = \partial Q/\partial V = 0$ is transformed into RX-plane Previously, it has been shown that the expression for $P_{(\partial Q \partial V=0)}$ in (21) and the expression for $Q_{(\partial P \partial V=0)}$ in (19) describe the same line on the PQV-surface where $\partial P/\partial V = \partial Q/\partial V = 0$.

Furthermore, as stated above, the solution for $P_{(\partial Q \partial V=0)}$ with the negative sign lies entirely on the same surface as the solution of $Q_{(\partial P\partial V=0)}$ with the positive sign. By rewriting and manipulating the solutions for $P_{(\partial Q\partial V=0)}$ and $Q_{(\partial P\partial V=0)}$ lying on the same surface gives:

$$P_{(\partial Q\partial V=0)} = \frac{R(E^2 - 2V^2) - XE\sqrt{4V^2 - E^2}}{2(R^2 + X^2)} = \frac{RA - XB}{C} \quad (41)$$

$$Q_{(\partial P\partial V=0)} = \frac{X(E^2 - 2V^2) - RE\sqrt{4V^2 - E^2}}{2(R^2 + X^2)} = \frac{XA + RB}{C} \quad (42)$$

Where $A=(E^2-2V^2)$, $B=E\sqrt{4V^2-E^2}$ and $C=2(R^2+X^2)$. The aim is to derive an expression for the line where $\partial P/\partial V=\partial Q/\partial V=0$. For that purpose, the following relationship is utilized:

$$\left(\frac{V^2}{Z_{LD}}\right)^2 = P^2 + Q^2 \quad (43)$$

Inserting the expressions for P and Q in (41-42) into above equation gives:

$$\left(\frac{V^2}{Z_{LD}}\right)^2 = \frac{R^2A^2 - 2RXAB + X^2B^2}{C^2} + \frac{X^2A^2 + 2RXAB + R^2B^2}{C^2} \quad (44)$$

$$= \frac{(R^2 + X^2)(A^2 + B^2)}{C^2}$$

$$= \frac{(A^2 + B^2)}{4(R^2 + X^2)}$$

$$= \frac{V^4}{Z_{LN}^2}$$

and solving for $Z_{LD}$ results in:

$$Z_{LD} = Z_{LN} \quad (45)$$

Hence, the set of points on the PQV-surface that describe $\partial P/\partial V=\partial Q/\partial V=0$ appear as a circle in the RX-plane with center at the origin and radius equal to the magnitude of $\overline{Z_{LN}}$. This result is in accordance with the well known maximum power transfer theorem for AC networks.

Figure 12:
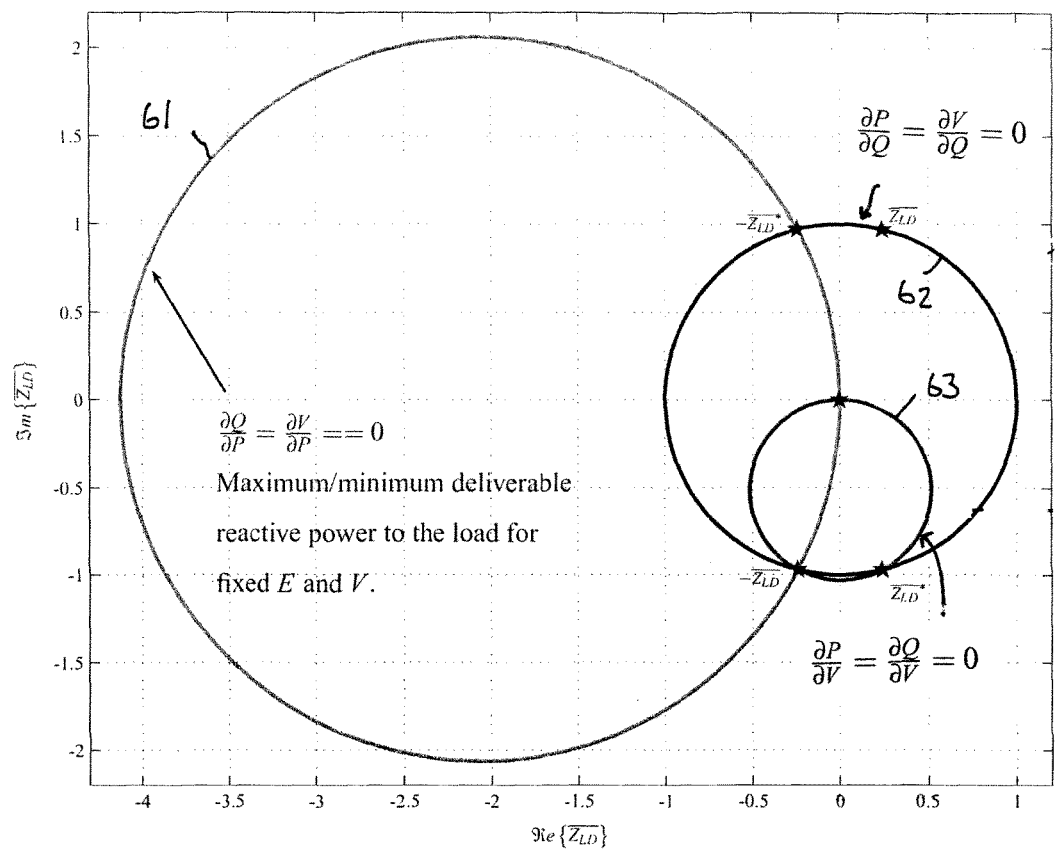
FIG. 12 is a graphical representation of the critical lines in the injection impedance plane.

FIG. 12 shows a plot of the three borderlines of interest. Above, it was shown that the line 62 where $\partial P/\partial V=\partial Q/\partial V=0$ appears as a circle in the impedance plane with its center at the origin and a radius equal the size of the line impedance $Z_{LN}$. The line 62 is plotted in the impedance plane and may be said to represent a maximum deliverable power through $Z_{LN}$ when the sending end voltage as well as $\theta$ or Q are maintained at fixed value in the calculations.

The line 63 where $\partial P/\partial Q=\partial V/\partial Q=0$ is a borderline which may be said to represent the maximum deliverable power through the line impedance $Z_{LN}$ when both the sending end and the receiving end voltages are fixed. The borderline 63 may be useful in determining the maximum transferrable power between two subsystems where the voltage in each subsystem is maintained constant by local generators.

The third line 61 shown in FIG. 12 may be said to represent the situation where $\partial P/\partial Q=\partial V/\partial Q=0$. The borderline 61 represents the situation where maximum or minimum reactive power is transferred through $Z_{LN}$ when both the sending end and receiving end voltage is fixed. The line 61 may be of some interest when studying stability in power system.

The previously derived mappings of the critical lines on the PQV-surface, where all the partial derivatives are zero, are useful for stability studies. For the purpose of establishing meaningful visualization of a given operating condition in an injection impedance plane, the mapping of lines of constant P, Q, V and $\delta$ may be of interest. In the following section, the mapping or transformation of those lines onto the PQV-surface are derived.

In order to derive expressions for lines of constant P in the injection impedance plane, the expression (12) may be used. In order to relate the values of P to $Z_{LD}$, it is preferred to express V and Q as a function of those variables. By expressing V and Q in terms of the injection impedance and the receiving end power gives:

$$V^2 = \frac{Z_{LD}P}{\cos\theta} \quad (46)$$

$$Q = P\tan\theta \quad (47)$$

An expression for values of constant P described as a function of $Z_{LD}$ may be obtained by putting (12) into powers of two and inserting the expressions for $V^2$ and Q from (46) and (47). After some manipulation, an expression of $Z_{LD}$ as circle in polar coordinates may be obtained:

$$ZLD = r_0 \cdot \cos(\theta-\varphi) \pm \sqrt{r^2 + r_0^2 \cdot \sin^2(\theta-\varphi)} \quad (48)$$

where:

$$r = \sqrt{\frac{E^4 - 4E^2RP}{4P^2}}$$

$$r_0 = \sqrt{X^2 + R^2 + \frac{E^4}{4P^2} - \frac{RE^2}{P}}$$

$$\tan\varphi = \frac{-X}{-\left(R - \frac{E^2}{2P}\right)}$$

The expression in (48) may be said to represents the set of points in the injection impedance plane where the receiving end power P is constant. Lines of constant power appear as circles in the injection impedance plane where, in the above, $r_0$ is the distance from the origin to the center of the circle, r is the radius of the circle and $\varphi$ is the angle between the positive real axis and the line connecting the origin and the center of the circle.

In order to derive expressions for lines of constant Q in the injection impedance plane, the expression in (12) may be used again along with the following expressions for $V^2$ and Q:

$$V^2 = \frac{Z_{LD}Q}{\sin\theta} \quad (49)$$

$$P = \frac{Q}{\tan\theta} \quad (50)$$

By inserting (49) and (50) into the square of (12) and solving for $Z_{LD}$ the following expression in polar coordinates may be obtained:

$$ZLD = r_0 \cdot \cos(\theta-\varphi) \pm \sqrt{r^2 + r_0^2 \cdot \sin^2(\theta-\varphi)} \quad (51)$$

where:

$$r = \sqrt{\frac{E^4 - 4E^2 XQ}{4Q^2}}$$

$$r_0 = \sqrt{X^2 + R^2 + \frac{E^4}{4Q^2} - \frac{XE}{Q}}$$

$$\tan\varphi = \frac{-\left(X - \frac{E^2}{2Q}\right)}{-R}$$

For a fixed value of Q, then equation (51) may represent a circle in the injection impedance plane where $r_o$ is the distance from the origin to the center of the circle, r is the radius of the circle and $\varphi$ is the angle between the positive real axis and the line connecting the origin and the center of the circle.

In order to derive expressions for lines of constant V in the injection impedance plane, the expression (9) is used along with the following expressions for P and Q:

$$P = \frac{V^2}{Z_{LD}}\cos\theta \quad (52)$$

$$Q = \frac{V^2}{Z_{LD}}\sin\theta \quad (53)$$

By inserting (46) and (47) into (9) and solving for $Z_{LD}$ results in the following expression in polar coordinates.

$$ZLD = r_0 \cdot \cos(\theta-\varphi) \pm \sqrt{r^2 + r_0^2 \cdot \sin^2(\theta-\varphi)} \quad (54)$$

where:

$$r = \frac{EV\sqrt{R^2 + X^2}}{V^2 - E^2}$$

$$r_0 = \frac{V^2\sqrt{R^2 + X^2}}{V^2 - E^2}$$

$$\tan\varphi = \frac{-X}{-R}$$

Again, it may be seen that that the lines of constant voltage are represented as circles in the injection impedance plane. As before, then $r_0$ is the distance from the origin to the center of the circle, r is the radius of the circle and $\varphi$ is the angle between the positive real axis and the line connecting the origin and the center of the circle.

In order to derive expressions for lines of constant bus voltage phase angle $\delta$ in the injection impedance plane, the following expressions for P and Q may be used:

$$P = \frac{V^2}{Z_{LD}}\cos\theta \quad (55)$$

$$P = \frac{EV\cos(\delta+\phi) - V^2\cos(\phi)}{Z_{LN}} \quad (56)$$

$$Q = \frac{V^2}{Z_{LD}}\sin\theta \quad (57)$$

$$Q = \frac{EV\sin(\delta+\phi) - V^2\sin(\phi)}{Z_{LN}} \quad (58)$$

By setting (55) equal to (56) and solving for V results in:

$$V = \frac{EZ_{LD}\cos(\delta+\phi)}{Z_{LN}\cos\theta + Z_{LD}\cos\phi} \quad (59)$$

Similar results may be obtained by setting (57) equal to (58) and solving for V:

$$V = \frac{EZ_{LD}\sin(\delta+\phi)}{Z_{LN}\sin\theta + Z_{LD}\sin\phi} \quad (60)$$

Setting (59) equal (60) and solving for $Z_{LD}$ yields:

$$ZLD = -\frac{Z_{LN}}{\sin\delta}\cdot\sin(\delta+\phi-\theta) \quad (61)$$

This equitation may represent a circle in the injection impedance plane when $\delta$ is constant. The circle represented in (61) has a diameter equal $Z_{LN}\sin\delta$ and intercepts the origin of the injection impedance plane and the point $\overline{Z_{LD}} = -\overline{Z_{LN}}$ for all values of constant $\delta$.

It may be seen that equation (61) represents the same circles in the impedance plane for $\delta=\delta_0$ and $\delta=-180+\delta_0$ where $\delta_0$ is arbitrary. Therefore, it is preferred to investigate which part of the circles represents constant $\delta=\delta_0$ and which part represents constant $\delta=-180+\delta_0$. For simplicity, it may be assumed that $0°\leq\delta_0<180°$. If $\delta_0=0°$, then from (61), it may be seen that the circle representing $\delta=\delta_0$ and $\delta=-180+\delta_0$ has a radius going towards infinity; eg. these conditions are represented by the straight line that intercepts the origin and the point where $\overline{Z_{LD}}=\overline{Z_{LD}}$. By inspection, it may be seen that the part of the line between the two singular points (eg. the origin and the point where $\overline{Z_{LD}}=-\overline{Z_{LD}}$ represents the condition where $\delta=\pm180°$ while the other parts of the line represents the points in the injection impedance plane where $\delta=0°$.

Figure 13A:
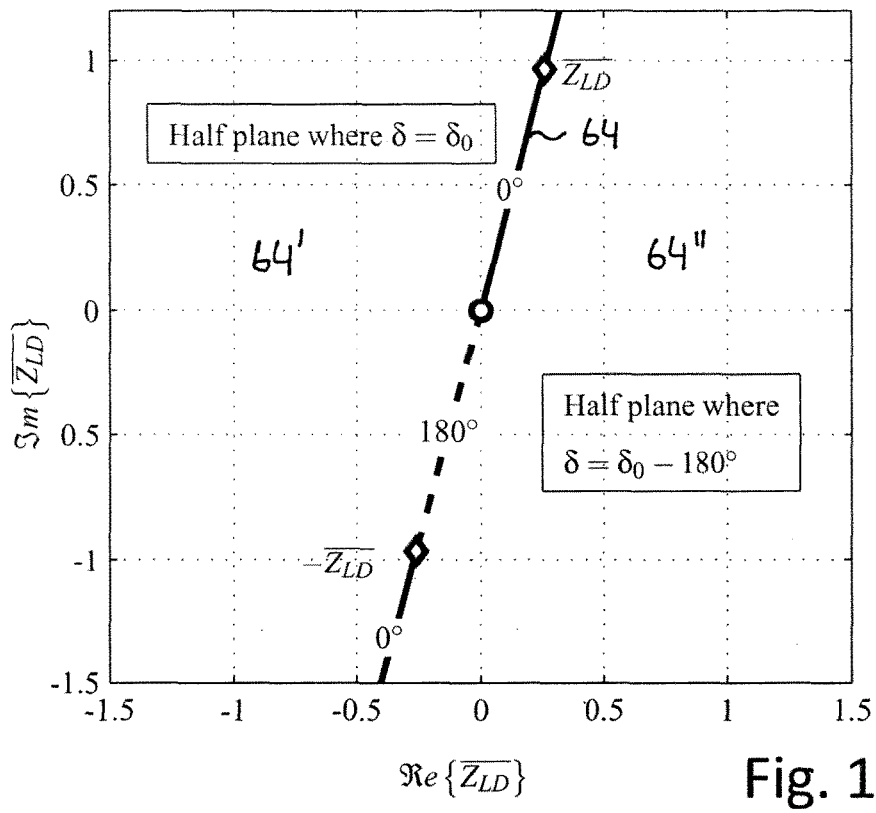
FIGS. 13a-b show lines of constant δ in the injection impedance plane.
Figure 13B:
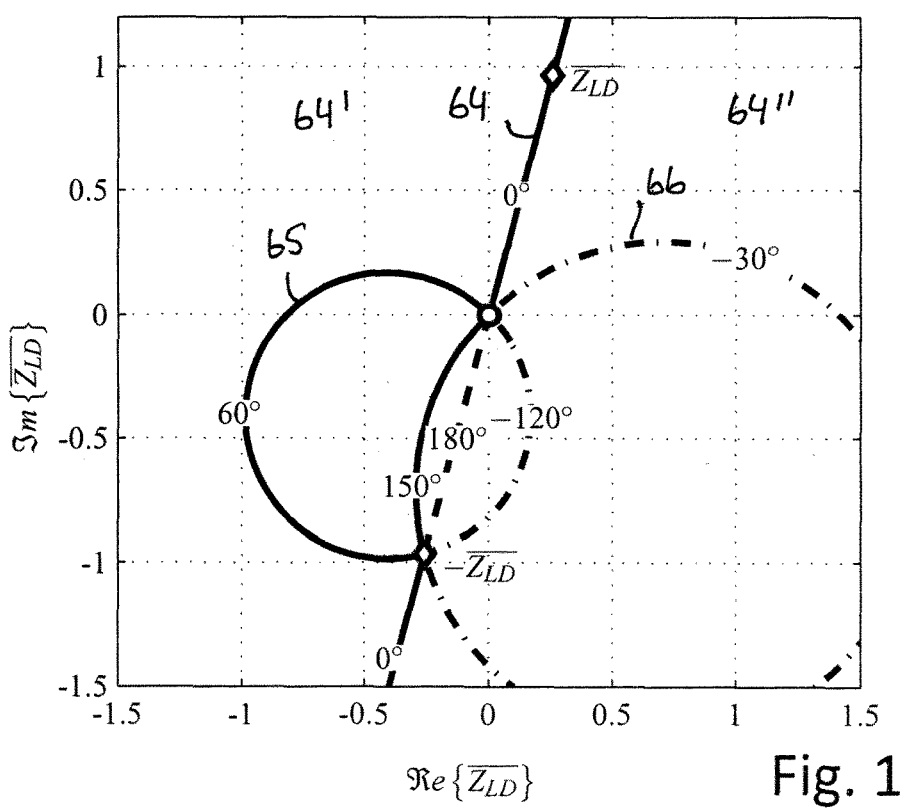

In FIG. 13a-b, if the line 64 intercepting the origin and $\overline{Z_{LD}}=-\overline{Z_{LD}}$ is used to split the impedance plane into two halves 64' and 64", then it may be seen, in FIG. 13b, that all of the circles representing the constant $\delta$ lie in both planes. The lines of constant $\delta$ where $\delta=\delta_0$ are represented by the part of the circle laying in the left half plane 64' while the part of the circle laying in the right half plane 64" represents the condition where $\delta=-180+\delta_0$. In FIGS. 13a-b, lines of constant $\delta$ in the injection impedance plane are shown. In FIG. 13a, a plot of the line 64 of constant $\delta$ for the special case where $\delta$ is either 0° or 180° is shown. These values of $\delta$ appears as a straight line 64, where the part between the origin and $-\overline{Z_{LD}}$ represents $\delta=\pm180°$, while other parts represent $\delta=0°$. In FIG. 13b, it is illustrated how the same circle in the impedance plane represents two different conditions of constant phase angle, depending on in which half plane 64', 64" the circle parts lie in.

In the FIGS. 14a-b and 15a-b, it is illustrated how lines of constant P, Q, V and $\delta$ appear in the injection impedance plane. The figures represent the situation where $\overline{Z_{LD}}=(1\angle\phi)$ and $\phi=75°$.

Figure 14A:
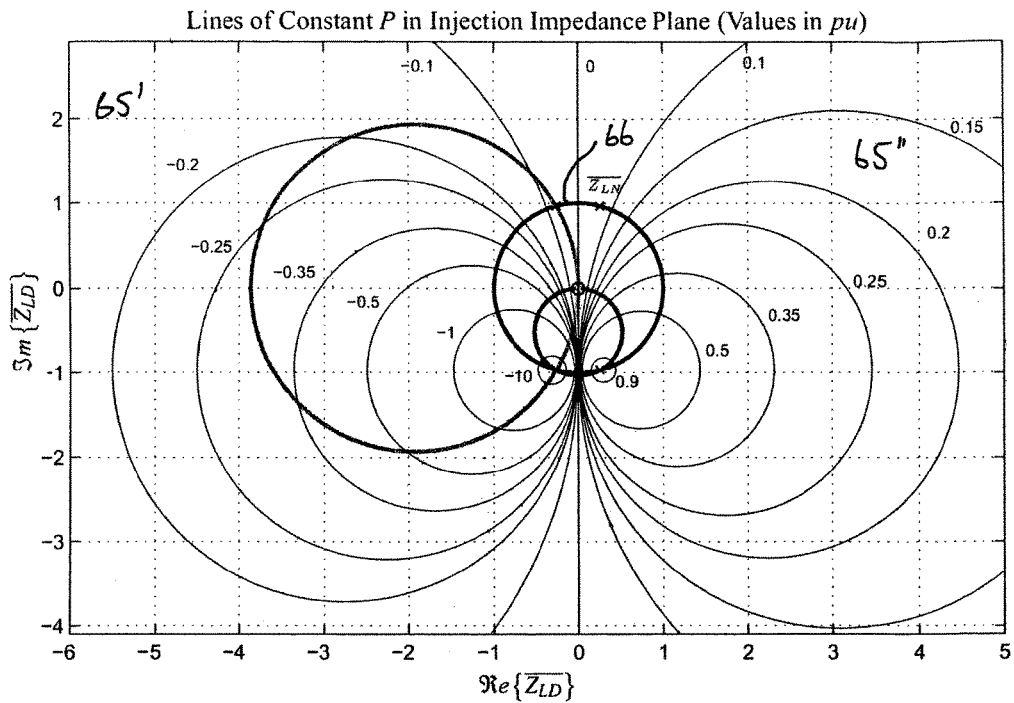
FIGS. 14a-b show lines of constant active and reactive power in the complex injection impedance plane.

FIG. 14a shows how the lines of constant receiving end power P appear in the complex injection impedance plane. By inspecting the lines of constant P, some sort of symmetric appearance may be recognized. Constant positive values of the receiving end power appear as circles in the left half plane 65' where the radius of the circle gradually decreases as the power is increased toward the point of maximum deliverable power. The point of maximum deliverable power 66 appears where the injection impedance is equal to the complex conjugate of the line impedance. Values of constant negative power at the receiving end are represented in the right half plane 65" of the injection impedance plane. The radius of the circles representing constant negative power P (positive node power injection) gradually decreases as the absolute value of the power increases. The point of minimum deliverable power (maximum node injection) occurs at the singular point where the injection impedance is equal to the negative of the line impedance. At this point the receiving end power P goes towards $-\infty$. The set of points representing the situation where P is zero, appears as straight line that satisfies R=0.

Figure 14B:
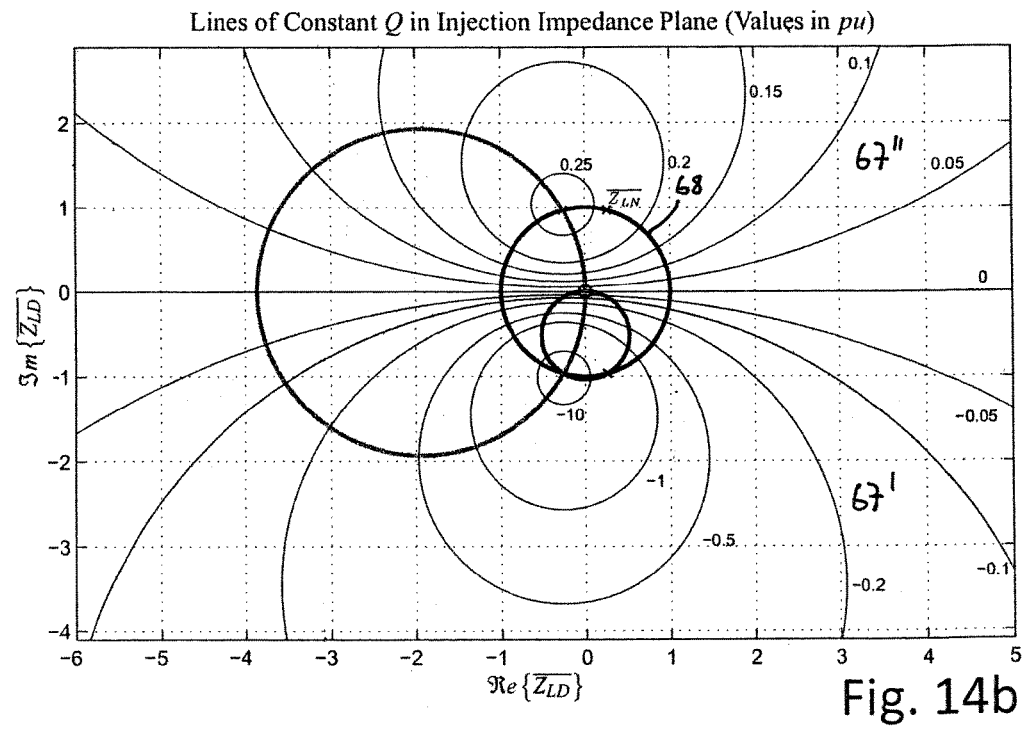

FIG. 14b shows how the lines of constant Q appear in the complex injection impedance plane. The lines for constant Q have a similar appearance as lines of constant P. The circles for constant positive values of Q appear in the upper half plane 67", where the radius of the circles gradually decreases until the point of maximum positive Q is obtained. The point of maximum Q 68 occurs when the value of the injection impedance is equal to the real conjugate of the line impedance ($X_{LD}=X_{LN}$ and $R_{LD}=-R_{LN}$). The circles representing negative constant values of Q appear in the lower half plane 67' and the minimum occurs at the singular point where the injection impedance is equal the negative of the line impedance. At the singular point, the value of Q goes towards $-\infty$. The set of points representing the situation where Q is zero, appears as straight line that satisfies X=0.

Figure 15A:
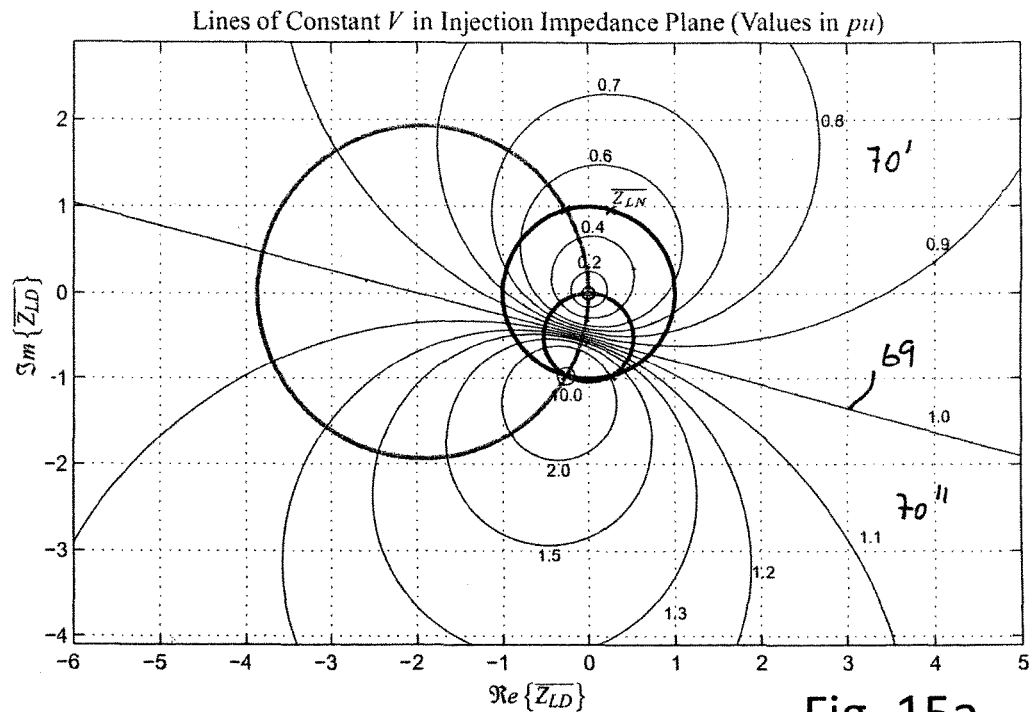
FIGS. 15a-b show lines of constant voltage magnitude V and voltage phase angle δ.

FIG. 15a shows how lines of constant V appear in the injection impedance plane. From FIG. 15a, it may be seen that circles 71 representing constant values of the receiving end voltage V have center points on the lines intercepting the origin of the injection impedance plane and the singular point where $\overline{Z_{LD}}=-\overline{Z_{LD}}$. The set of points where V=E appears as straight line 69 that is perpendicular to an imaginary line between the origin and $\overline{Z_{LD}}=-\overline{Z_{LD}}$ and intercepts that line in the point where $\overline{Z_{LD}}=-\overline{Z_{LD}}2$. The line representing V=E divides the injection impedance plane into to half planes, where constant voltages lower than E appear as circles in the upper half plane 70' containing the origin, while voltages higher than E appear as circles in the lower half plane 70" containing the singular point $\overline{Z_{LD}}=-\overline{Z_{LD}}$.

Figure 15B:
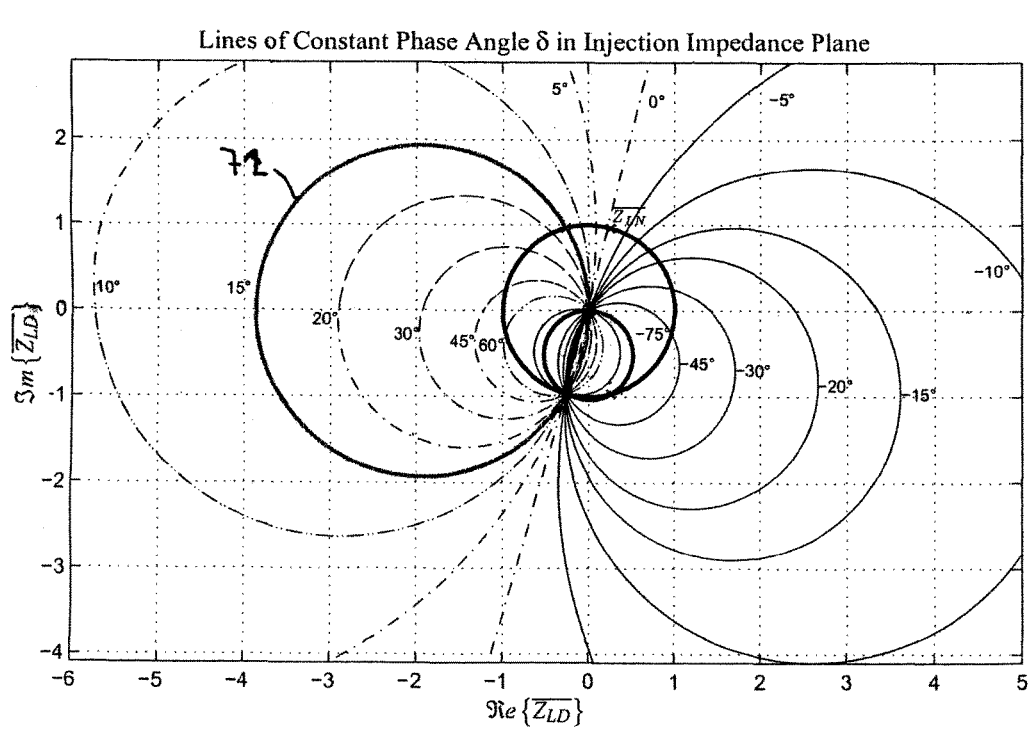

The lines of constant voltage phase angle $\delta$ are shown in FIG. 15b, as circles in the injection impedance plane where all circles 72 intercept the origin and the singular point where $\overline{Z_{LD}}=-\overline{Z_{LD}}$. The part of the circles going in clockwise direction from the origin to $\overline{Z_{LD}}=-\overline{Z_{LD}}$ represents positive angles of $\delta$ (if $\delta$ is defined to lie in the range $-180°<\delta\leq180°$) while the part of the circle going in counter clockwise direction from the origin to $\overline{Z_{LD}}=-\overline{Z_{LD}}$ represents the points where $\delta$ is negative.

Furthermore, it may be seen that the circle where the partial derivative $\partial P/\partial Q=0$ is the same as the circle representing fixed phase angle where $\delta=-\phi$ and $\delta=180-\phi$. This means that the point of maximum deliverable power to the receiving end in FIG. 9 when V and E are fixed occurs when $\delta=-\phi$ and the point of minimum deliverable power (maximum injectable power) to the receiving end for fixed V and E occurs when $\delta=180-\phi$.

Similarly, it may be seen that the circle where the partial derivative $\partial Q/\partial P=0$ is the same as the circle representing fixed phase angle where $\delta=-90°-\phi$ and $\delta=90°-\phi$. This means that the part of the circle where $\delta=-90°-\phi$ represents the points of maximum deliverable reactive power when V and E are fixed, while $\delta=90°-\phi$ represents the minimum deliverable (maximum reactive power injection) reactive power for the same conditions.

The expressions for the PQV-characteristics in the impedance plane of a system as shown in FIG. 9 may be used to provide an analytical solution of the load flow problem for this simple two node system. By using the sending end as a reference node, power flow solutions may be obtained analytically by considering where the circles of constant P and Q intercept in the injection impedance plane.

Equation (48) may be said to describe the lines of constant P as function of E,R,X and $\theta$. With values of P and Q specified, $\theta$ is known and the load impedance values corresponding to the load flow solutions may be directly determined from (48). With the load impedance known, the receiving end node complex voltage may be determined.

In the above, an analytical derivation of the mapping of critical and characteristic lines from a three dimensional PQV-surface into the injection plane has been discussed. It is seen that the critical lines of interest are the lines where the partial derivative of the variables P, Q and V in respect to each other are equal to zero.

The line satisfying $\partial P/\partial Q=0$ may represent a maximum receivable or injectable power to a node when the voltage in both ends is fixed. This limit appeared as a circle in the impedance plane that intercepted the origin and the points where the injection impedance was equal the negative of the line impedance and equal the complex conjugate of the impedance. This boundary may be of interest when determining the maximum power a given generator may inject into a node of constant voltage. If an observation of the injection impedance crosses these limits, the generator may lose its synchronism with the rest of the system. In fact, the boundary satisfying $\partial P/\partial Q=0$ may be seen as preferred boundary when performing a real time stability assessment of a power system.

The mapping of characteristic lines into the injection impedance plane may be useful when visualizing information about a given system condition in a real time application. The knowledge of how critical operational boundaries other characteristic lines appear in the impedance plane may be useful for obtaining a situational awareness for a given operating condition. The derived lines may illustrate where stability and operational boundaries are located in respect to the observed operating point. In this way information concerning distance to boundaries of critical operation may be visualized in real time.

Furthermore, the analytical derivation of potentially critical stability boundaries in the impedance plane enables a normalization of multiple operating points in such way that the same critical boundary applies to all of the normalized points. Hereby, multiple operating points may be visualized on the same screen and held against the same normalized boundary for stable operation.

The invention claimed is:

1. A method for assessment of a power system generator, the power system having a plurality of generators injecting power into a network having a plurality of nodes and a plurality of branches, the plurality of generators comprising one or more synchronous machines, each including a rotor, and being represented in the network by a plurality of nodes of power injection, the method comprising:

determining a present state of the power system, calculating system Thevenin impedances from each node of power injection in the power system on the basis of the determined present state of the power system, calculating injection impedances from each node of power injection in the power system on the basis of the determined present state of the power system, determining a stability boundary for each generator as a function of the calculated system Thevenin impedances and the calculated injection impedances, and determining a rotor angle stability of the rotor for each generator based on the determined stability boundary, wherein the operations performed in the method reduce a computation time needed to assess a stability of the power system generator and, therefore, reduce an amount of time needed to detect an unstable condition and perform remedial action on the power system generator.

2. The method according to claim 1, wherein the stability boundary indicates the maximum steady state electrical power that a generator can produce in order to maintain operation at a stable equilibrium point.

3. The method according to claim 1, wherein the stability boundary is dependent on an angle, $\varphi_{TH}$, of the Thevenin impedance.

4. The method according to claim 1, wherein the stability boundary is determined as $$Z_{inj} = -\frac{Z_{TH}\sin\theta}{\sin\phi_{TH}}$$

wherein $Z_{TH}$ is the system Thevenin Impedance as seen from the generator, $Z_{inj}$ is the injection impedance; $\varphi_{TH}$ is the angle of the system, $Z_{th}$ the Thevenin Impedance, and $\theta$ is the angle of the injection impedance.

5. The method according to claim 1, further comprising the step of comparing for each generator the determined stability boundary with the injection impedance to determine a generator security margin for each generator.

6. The method according to claim 1, wherein the step of determining a present state of the power system comprises obtaining synchronized measurements in real time of voltage and current phasors.

7. The method according to claim 1, wherein the step of determining a present state of the power system comprises obtaining synchronized Phasor Measurement Unit measurements from a plurality nodes of the power system.

8. A method according to claim 1, wherein the calculation of the Thevenin Impedance for each node of power injection is performed assuming a constant steady state voltage magnitude for each node of injection.

9. The method according to claim 1, wherein the criteria for stability for a given generator is $$C = \left|\frac{\overline{Z}_{inj} \cdot (2\sin\phi_{TH}) + j \cdot Z_{TH}}{Z_{TH}}\right|$$

wherein $Z_{TH}$ is the system Thevenin Impedance as seen from the generator, $\vec{Z}_{inj}$ is the injection impedance, $\varphi_{TH}$ is the angle of the system Thevenin Impedance $\vec{Z}_{TH}$ as seen from the j'th generator.

10. The method according to claim 9, wherein the generator is stable if the value C is larger than 1, the generator is unstable if C is less than 1 and wherein the generator is operating at the stability boundary if C=0.

11. The method according to claim 1, wherein the present state of the power system is determined sequentially, and wherein for each or for a predetermined fraction of the sequential determinations of a present state of the power system, the injection impedance, the system Thevenin impedance and the corresponding stability boundary is determined for each generator.

12. The method according to claim 1, wherein the stability boundary is determined in real-time.

13. The method according to claim 1, wherein a margin from an operating point of a generator to the stability boundary condition for the generator is determined.

14. The method according to claim 13, wherein the margin indicates how much a phase angle for the generator may be increased before the stability boundary is reached.

15. The method according to claim 1, wherein the stability boundary is a boundary of maximum injectable power into a given system node.

16. The method according to claim 1, further comprising determining, for a specific generator, whether an increase in a voltage phase angle at the corresponding node of injection causes an increase in the injected power.

17. The method according to claim 1, wherein the stability boundary and/or the system security margin is automatically determined.

18. The method according to claim 1, wherein the injection impedance is calculated as $$Z_{inj} = -Z_{TH}\sin\theta/\sin\varphi_{TH}.$$

19. The method according to claim 1, wherein the Thevenin Impedance is calculated as seen from the generator with all other generators of constant voltage shorted, as $Z_{TH}=Vth/Ith$.

20. The method according to claim 1, wherein the Thevenin Impedance for each of the plurality of generators is calculated using only a single LU-factorization of the admittance matrix.

21. The method according to claim 1, wherein the calculation time from determination of the present state of the power system to the current stability boundary is between 5 and 10 ms.

22. A computer program comprising program code means for performing the method according to claim 1 when said computer program is run on a computer.

23. A non-transitory computer readable medium having stored thereon program code means for performing the method of claim 1 when said program code means is run on a computer.

24. An early warning system for assessing a power system, the power system having a plurality of generators injecting power into a network having a plurality of nodes and a plurality of branches, the plurality of generators comprising one or more synchronous machines, each including a rotor, and being represented in the network by a plurality of nodes of power injection, the system comprises a data processing means configured to:

obtain a present state of the power system, calculate system Thevenin impedances from each node of power injection in the power system on the basis of the determined present state of the power system, calculate injection impedances from each node of power injection in the power system on the basis of the determined present state of the power system, determine a stability boundary for each generator as a function of the calculated system Thevenin impedances and the calculated injection impedances, and determine a rotor angle stability of the rotor for each generator based on the determined stability boundary, and an interface means for outputting the determined stability boundary, wherein the operations performed by the data processing reduce a computation time needed to assess a stability of the power system and, therefore, reduce an amount of time needed to detect an unstable condition and perform remedial action on the power system.

25. A method of early warning for a power system, the power system having a plurality of generators injecting power into a network having a plurality of nodes and a plurality of branches, the plurality of generators comprising one or more synchronous machines, each including a rotor, and being represented in the network by a plurality of nodes of power injection, the method comprising:
  determining a present state of the power system,
  calculating system Thevenin impedances from each node of power injection in the power system on the basis of the determined present state of the power system,
  calculating injection impedances from each node of power injection in the power system on the basis of the determined present state of the power system,
  determining a stability boundary for each generator as a function of the calculated system Thevenin impedances and the calculated injection impedances,
  determine a rotor angle stability of the rotor for each generator based on the determined stability boundary,
  comparing for each generator the determined stability boundary with the injection impedance to determine a generator security margin for each generator, and issuing a warning if the generator security margin is below a predetermined value,
  wherein the operations performed by the method reduce a computation time needed to assess a stability of the power system and, therefore, reduce an amount of time needed to detect an unstable condition and perform remedial action on the power system.

* * * * *